(12) United States Patent
Lim

(10) Patent No.: US 10,374,641 B2
(45) Date of Patent: Aug. 6, 2019

(54) ELECTRONIC DEVICE HAVING MULTIBAND ANTENNA AND METHOD FOR SWITCHING IN ELECTRONIC DEVICE HAVING MULTIBAND ANTENNA

(71) Applicant: Samsung Electronics Co., Ltd., Suwon-si, Gyeonggi-do (KR)

(72) Inventor: Won-Sub Lim, Seongnam-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/861,075

(22) Filed: Jan. 3, 2018

(65) Prior Publication Data
US 2018/0198472 A1    Jul. 12, 2018

(30) Foreign Application Priority Data

Jan. 12, 2017   (KR) .................. 10-2017-0005588

(51) Int. Cl.
| H04B 1/00 | (2006.01) |
| H04B 1/40 | (2015.01) |
| H01Q 5/30 | (2015.01) |
| H03K 17/16 | (2006.01) |
| H03K 17/10 | (2006.01) |
| H03K 17/687 | (2006.01) |
| H03K 17/693 | (2006.01) |

(52) U.S. Cl.
CPC .............. H04B 1/006 (2013.01); H01Q 5/30 (2015.01); H03K 17/102 (2013.01); H03K 17/162 (2013.01); H03K 17/6874 (2013.01); H03K 17/693 (2013.01); H04B 1/40 (2013.01); H03K 2217/0054 (2013.01)

(58) Field of Classification Search
CPC combination set(s) only.
See application file for complete search history.

(56) References Cited

U.S. PATENT DOCUMENTS 5,731,607 A * 3/1998 Kohama ............. H01L 27/0629
                                                          257/275
7,199,635 B2   4/2007 Nakatsuka et al.
7,808,222 B2  10/2010 Ueunten
(Continued)

FOREIGN PATENT DOCUMENTS

| EP | 1 508 974 A2 | 2/2005 |
| KR | 10-2015-0034767 A | 4/2015 |
| WO | 2008/133621 A1 | 11/2008 |

*Primary Examiner* — Junpeng Chen
(74) *Attorney, Agent, or Firm* — Jefferson IP Law, LLP

(57) ABSTRACT

A multiband antenna-equipped electronic device is provided. An electronic device includes a housing, a memory, an antenna for multi-band communication, a communication unit processing a radio frequency (RF) signal using the antenna, a switching unit including a first switch connected with a first point of the antenna, a second switch connected between the first switch and a second point of the antenna, a third switch connected with a third point of the antenna, a fourth switch connected between the second point and the third switch, a fifth switch connected between a first node between the first switch and the second switch and a ground, and a sixth switch connected between a second node between the third switch and the fourth switch and the ground, and a processor electrically connected with the memory, the communication unit, and the switching unit.

20 Claims, 18 Drawing Sheets

(56) References Cited

U.S. PATENT DOCUMENTS

| | | | |
|---|---|---|---|
| 8,559,907 B2* | 10/2013 | Burgener | H01Q 23/00 |
| | | | 455/333 |
| 8,868,008 B2 | 10/2014 | Tanaka et al. | |
| 8,977,217 B1 | 3/2015 | Connick et al. | |
| 9,450,579 B2* | 9/2016 | Madan | H04B 1/44 |
| 9,628,070 B2* | 4/2017 | Jang | H03K 17/161 |
| 2006/0118884 A1* | 6/2006 | Losehand | H01L 27/088 |
| | | | 257/376 |
| 2006/0270367 A1 | 11/2006 | Burgener et al. | |
| 2006/0276158 A1* | 12/2006 | Okabe | H04B 1/38 |
| | | | 455/333 |
| 2007/0058748 A1* | 3/2007 | Kim | H04B 1/52 |
| | | | 375/295 |
| 2010/0327948 A1* | 12/2010 | Nisbet | H03K 17/687 |
| | | | 327/436 |
| 2013/0064144 A1 | 3/2013 | Millard et al. | |
| 2014/0009209 A1 | 1/2014 | Cebi et al. | |
| 2014/0009214 A1* | 1/2014 | Altunkilic | H03K 17/161 |
| | | | 327/427 |
| 2014/0335802 A1 | 11/2014 | Zhao et al. | |
| 2015/0222026 A1* | 8/2015 | Tombak | H01Q 1/523 |
| | | | 343/876 |
| 2016/0190231 A1* | 6/2016 | Ishimaru | H01L 21/263 |
| | | | 257/66 |
| 2017/0085257 A1* | 3/2017 | Bakalski | H04B 1/006 |

\* cited by examiner

| Coff | Zc (@900Mhz) | Vpeak (@ RF 32dBm) |
|---|---|---|
| 100fF | 1768Ω | 59 V |
| 120fF | 1473Ω | 54 V |
| 140fF | 1263Ω | 50 V |
| 160fF | 1105Ω | 47 V |
| 180fF | 982Ω | 44 V |
| 200fF | 884Ω | 42 V |

ELECTRONIC DEVICE HAVING MULTIBAND ANTENNA AND METHOD FOR SWITCHING IN ELECTRONIC DEVICE HAVING MULTIBAND ANTENNA

CROSS-REFERENCE TO RELATED APPLICATION(S)

This application claims the benefit under 35 U.S.C. § 119(a) of a Korean patent application filed on Jan. 12, 2017 in the Korean Intellectual Property Office and assigned Serial number 10-2017-0005588, the entire disclosure of which is hereby incorporated by reference.

TECHNICAL FIELD

The present disclosure relates to electronic devices with multiband antennas.

BACKGROUND

Various mobile communication schemes and frequency bands are adopted for personal mobile communication as communication technology develops. For example, such communication schemes include, e.g., global system for mobile communication (GSM), EGSM, digital cellular switch (DCS), personal communication service (PCS), and wideband code division multiple access (WCDMA), which may use frequency bands, such as 700 Mhz, 850 Mhz, 900 Mhz, 1.8 Ghz, 1.9 Ghz, 2.1 Ghz, or 2.6 Ghz.

Other communication schemes or frequency bands may also be put to use. Recently under discussion is fifth generation (5G) communication system or pre-5G communication system to respond to the demand for increasing wireless data traffic since 4G communication system came into commerce. Adopting ultra-high frequency millimeter wave (mmWave) bands (e.g., 60 GHz bands) is taken into account for 5G communication system or pre-5G communication system.

Diversified communication schemes and frequency bands require multiband antenna-equipped electronic devices, (e.g., multiband terminals) that can selectively use the existing frequency bands and the newly added frequency bands. Multiband terminals may be terminals having a multiband transceiver and capable of transmitting and receiving multiband signals. A multiband terminal performs switching on the multiband antenna through a multiband antenna switching module to selectively use one of the multiple bands. A multiband antenna may be implemented by putting a switch between an antenna and another.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a switch adopted for a multiband antenna may create spurious harmonics when a signal higher than Vpeak is applied thereto, which may cause a radio spurious emission (RSE).

An RSE refers to the emission of unnecessary components irrelevant to the transmit/receive frequency through the antenna, and this may deteriorate communication performance. There may be pre-specified RSE standards for electronic devices to ensure communication performance. An electronic device is recommended to meet its RSE standards. An electronic device may be certified depending on the results of an RSE standard test. The RSE standard test may be a test for measuring the power of a spurious emission that departs from the frequency band permitted for the wireless communication electronic device.

According to an embodiment of the present disclosure, a multiband antenna-equipped electronic device may require a scheme for preventing an RSE from occurring through the antenna or enabling an RSE already caused to meet pre-defined RSE standards.

According to an embodiment of the present disclosure, there may be provided a multiband antenna-equipped electronic device and switching method for the same, which may prevent an RSE from occurring through the antenna by removing spurious harmonics that may arise when a signal higher than a pre-designated Vpeak value is applied to a switch upon applying the switch to the antenna.

According to an embodiment of the present disclosure, there may be provided a multiband antenna-equipped electronic device and switching method for the same, which allow pre-defined RSE standards to be met by preventing an RSE from occurring due to the switch applied to the antenna.

According to an embodiment of the present disclosure, there may be provided a multiband antenna-equipped electronic device and switching method for the same, which may prevent a parasitic loop from occurring in off-state switches among switches applied to the antenna.

In accordance with an aspect of the present disclosure, an electronic device is provided. The electronic device includes a housing, a memory, an antenna for multi-band communication, a communication unit processing a radio frequency (RF) signal using the antenna, a switching unit including a first switch connected with a first branch point of the antenna, a second switch connected between the first switch and a second branch point of the antenna, a third switch connected with a third branch point of the antenna, a fourth switch connected between the second branch point and the third switch, a fifth switch connected between a first node between the first switch and the second switch and a ground, and a sixth switch connected between a second node between the third switch and the fourth switch and the ground, and a processor electrically connected with the memory, the communication unit, and the switching unit, wherein the memory stores instructions executed to enable the processor to perform control to turn on the first switch, the second switch, and the sixth switch and turn off the third switch, the fourth switch, and the fifth switch to form a first path, or to turn off the first switch, the second switch, and the sixth switch and turn on the third switch, the fourth switch, and the fifth switch to form a second path.

In accordance with another aspect of the present disclosure, a method for switching in an electronic device is provided. The method includes an antenna for multiband communication and a switching unit, the switching unit including a first switch connected with a first branch point of the antenna, a second switch connected between the first switch and a second branch point of the antenna, a third switch connected with a third branch point of the antenna, a fourth switch connected between the second branch point and the third switch, a fifth switch connected between a first node between the first switch and the second switch and a ground, and a sixth switch connected between a second node between the third switch and the fourth switch and the ground may comprise turning on the first switch, the second switch, and the sixth switch and turning off the third switch, the fourth switch, and the fifth switch to form a first path corresponding to a first band as the first band is selected from among the multiple bands and turning off the first switch, the second switch, and the sixth switch and turning on the third switch, the fourth switch, and the fifth switch to form a second path corresponding to a second band as the second band is selected from among the multiple bands.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, wherein.

Throughout the drawings, like reference numerals will be understood to refer to like parts, components, and structures.

DETAILED DESCRIPTION

Figure 1A:
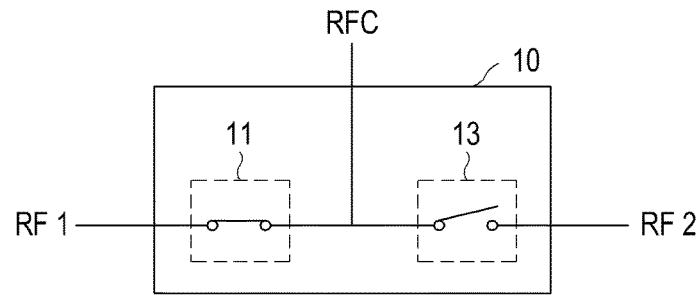
FIGS. 1A and 1B are views illustrating a multiband antenna switch according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the terms "configured to" may be interchangeably used with other terms, such as "suitable for," "capable of," "modified to," "made to," "adapted to," "able to," or "designed to" in hardware or software in the context. Rather, the term "configured to" may mean that a device can perform an operation together with another device or parts. For example, the term "processor configured (or set) to perform A, B, and C" may mean a generic-purpose processor (e.g., a central processing unit (CPU) or application processor (AP)) that may perform the operations by executing one or more software programs stored in a memory device or a dedicated processor (e.g., an embedded processor) for performing the operations.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a MP3 player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In some embodiments, examples of the smart home appliance may include at least one of a television, a digital video disc (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame.

According to an embodiment of the present disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, a sailing electronic device (e.g., a sailing navigation device or a gyro compass), avionics, security devices, vehicular head units, industrial or home robots, drones, automatic teller's machines (ATMs), point of sales (POS) devices, or internet of things (IoT) devices (e.g., a bulb, various sensors, a sprinkler, a fire alarm, a thermostat, a street light, a toaster, fitness equipment, a hot water tank, a heater, or a boiler). According to various embodiments of the disclosure, examples of the electronic device may at least one of part of a piece of furniture, building/structure or vehicle, an electronic board, an electronic signature receiving device, a projector, or various measurement devices (e.g., devices for measuring water, electricity, gas, or electromagnetic waves). According to embodiments of the present disclosure, the electronic device may be flexible or may be a combination of the above-enumerated electronic devices. According to an embodiment of the present disclosure, the electronic device is not limited to the above-listed embodiments. As used herein, the term "user" may denote a human or another device (e.g., an artificial intelligent electronic device) using the electronic device.

Figure 1B:
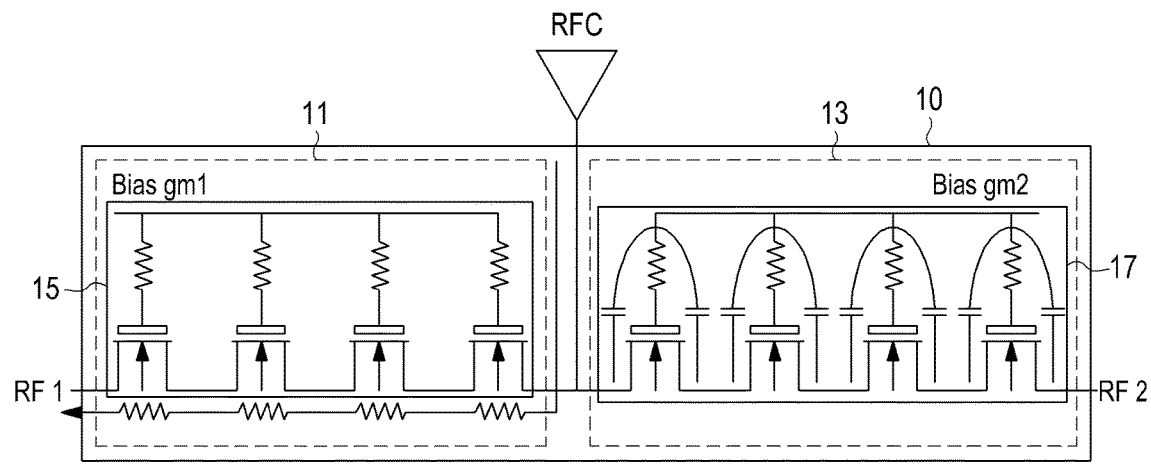

FIGS. 1A and 1B are views illustrating a multiband antenna switch according to an embodiment of the present disclosure.

Referring to FIG. 1A, the multiband antenna switch may be a single pole double through (SPDT) antenna switch 10. The SPDT antenna switch 10 may be connected between a transceiver circuit and an antenna. The SPDT antenna switch 10 may include a first terminal (radio frequency common (RFC)) connected to a first branch point of the antenna, a second terminal (radio frequency 1 (RF1)) connected to a second branch point of the antenna, and a third terminal (RF2) connected to a third branch point of the antenna. The first terminal RFC may be a pole, and the second and third terminals, each, may be a throw.

The SPDT antenna switch 10 may include a plurality of switches. For example, the SPDT antenna switch 10 may include a first switch 11 and a second switch 13. The first switch 11 may switch between the first terminal RFC and the second terminal RF1, and the second switch 13 may switch between the first terminal RFC and the third terminal RF2.

When the first switch 11 turns on, and the second switch 13 turns off, the first terminal RFC may be connected with the second terminal RF1, and the first terminal RFC may be disconnected from the third terminal RF2, so that a signal from the transceiver circuit may be delivered from the first branch point of the antenna to the second branch point of the antenna. Thus, a signal may flow to the antenna along a first path by which first resonance may be produced. When the first switch 11 turns off, and the second switch 13 turns on, the first terminal RFC may be connected with the third terminal RF2, and the first terminal RFC may be disconnected from the second terminal RF1, so that a signal from the transceiver circuit may be delivered from the third branch point of the antenna to the second branch point of the antenna. Thus, a signal may flow to the antenna along a second path by which second resonance may be produced.

Referring to FIG. 1B, the first switch 11 and the second switch 13 of the SPDT antenna switch 10 may include a first field effect transistor (FET) module 15 and a second FET module 17, respectively. The first FET module 15 and the second FET module 17 each may include a plurality of FET devices. When a first bias voltage gm1 is applied to each of the respective gates of the plurality of FET devices in the first FET module 15, the first switch 11 turns on, electrically connecting the first terminal RFC with the second terminal RF1. When a second bias voltage gm2 is applied to each of the respective gates of the plurality of FET devices in the second FET module 17, the second switch 13 turns on, electrically connecting the first terminal RFC with the third terminal RF2. The SPDT antenna switch 10 may be configured so that the second switch 13 turns off when the first switch 11 turns on while the first switch 11 turns off when the second switch 13 turns on.

When the second switch 13 turns off while the first switch 11 is on, parasitic capacitance may be generated in the second switch 13 by the plurality of FET devices, and such parasitic capacitance may influence the impedance $Z_c$ of the second switch 13. For example, the impedance by the parasitic capacitance may be represented as $Z_C=1/(j\psi C)$ and may thus be increased as the parasitic capacitance reduces.

If the first switch 11 turns off while the second switch 13 is on, parasitic capacitance may be generated in the first switch 11 by the plurality of FET devices, and such parasitic capacitance may influence the impedance $Z_c$ of the first switch 11.

Accordingly, while the first switch 11 or the second switch 13 turns off, the impedance and voltage of the turned-off switch may be varied by the parasitic capacitance Coff of the turned-off switch. According to an embodiment of the present disclosure, the FET devices of the antenna switch may be manufactured to have a parasitic capacitance Coff from 100 fF to 200 fF, and Vpeak may be implemented to enable normal operation at less than a preset voltage value. According to an embodiment of the present disclosure, Vpeak may be implemented to enable normal operation at less than 55V.

Figures 2, 3:
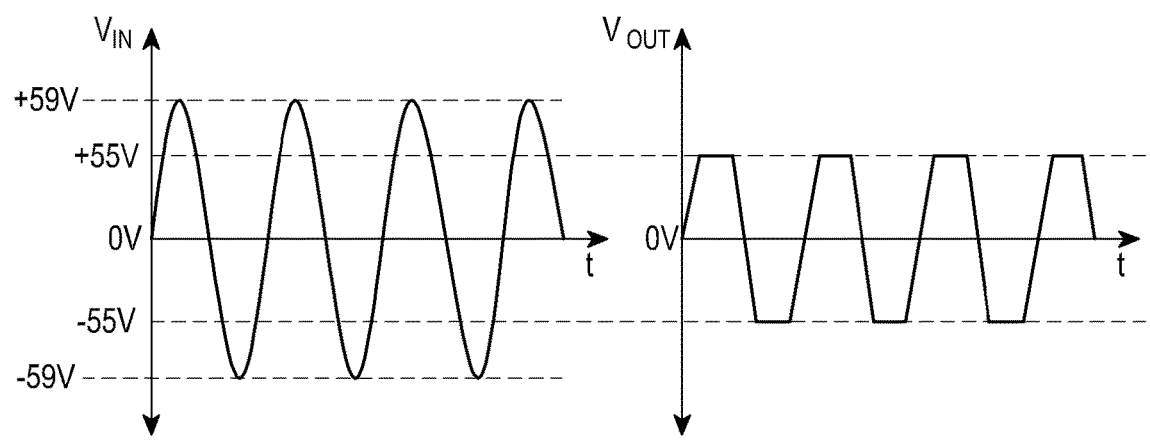
FIG. 2 is a table illustrating example Vpeak values as per parasitic capacitances Coff of a switch when transmit signals are applied to the switch according to an embodiment of the present disclosure.
FIG. 3 illustrates graphs for an input voltage and an output voltage for an antenna switch according to an embodiment of the present disclosure.

FIG. 2 is a table illustrating examples of Vpeak according to parasitic capacitances Coff of a switch when a transmit signal is applied to the switch according to an embodiment of the present disclosure.

Referring to FIG. 2, according to an embodiment of the present disclosure, a 900 Mhz 32 dBm transmit signal may be applied to the switch. When the switch has a Coff value between 100 fF and 200 fF according to an equation, such as $Z_C=1/(j\psi C)$, $Z_C$ according to the 900 Mhz band signal may become 1768Ω to 884Ω. Further, $V_{peak}=\sqrt{2RP}$ when 32 dbm and $Z_C$ are substituted for p (power) and R in the equation, Vpeak may become 59V to 42V.

FIG. 3 illustrate graphs for an input voltage and an output voltage for an antenna switch according to an embodiment of the present disclosure.

Referring to FIG. 3, when a threshold voltage for the antenna switch is 55V, and Vpeak applied to the antenna switch is 59V, the input and output voltages for the switch may be represented in the graphs. When the antenna switch is implemented to process signals of 55V or less, the antenna switch, upon receiving a 59V signal (Vin), may clip the portion over 55V off the signal and output only the 55V or less portion as the output signal Vout. As such, the clipping may cause non-linearity between the input and output signals. Further, the signal portion clipped-off, i.e., the portion over 55V, may cause spurious harmonics, e.g., 3rd or 5th harmonics. The spurious harmonics may be frequency components other than frequency bands specified.

Figure 4:
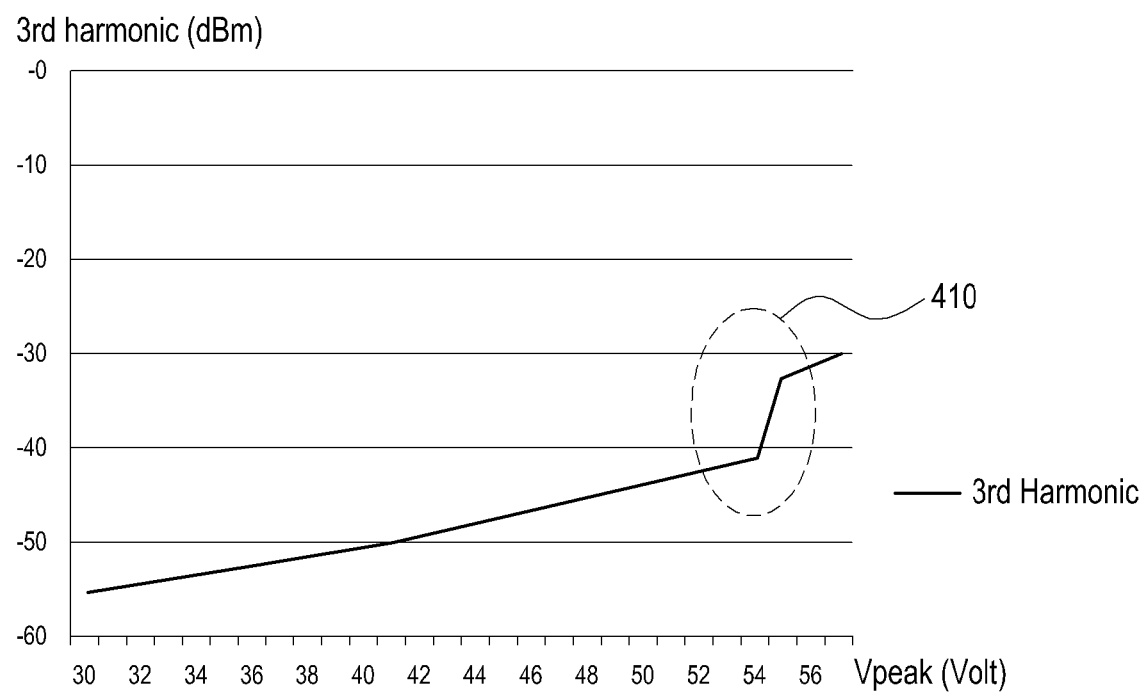
FIG. 4 is a view illustrating results of measurement of 3rd harmonic signals as per Vpeak of a switch according to an embodiment of the present disclosure.

FIG. 4 is a view illustrating results of measurement of a 3rd harmonic signal as per Vpeak of a switch, according to an embodiment of the present disclosure.

Referring to FIG. 4, it may be verified that when a 900 Mhz signal is applied to a switch having a Coff value of 100 fF, the 3rd harmonic signal drastically increases near 55V 410. As such, the drastically increased 3rd harmonic signal may flow into the antenna through the switch and may then be emitted to the air through the antenna which may correspond to a radio spurious emission (RSE). The RSE is an unnecessary frequency signal that may affect transmission of information through the transmit band, deteriorating radio communication capacity. The RSE may also influence devices using other frequencies and result in a failure to meet RSE standards specified to ensure the communication capacity of the electronic device.

Figure 5:
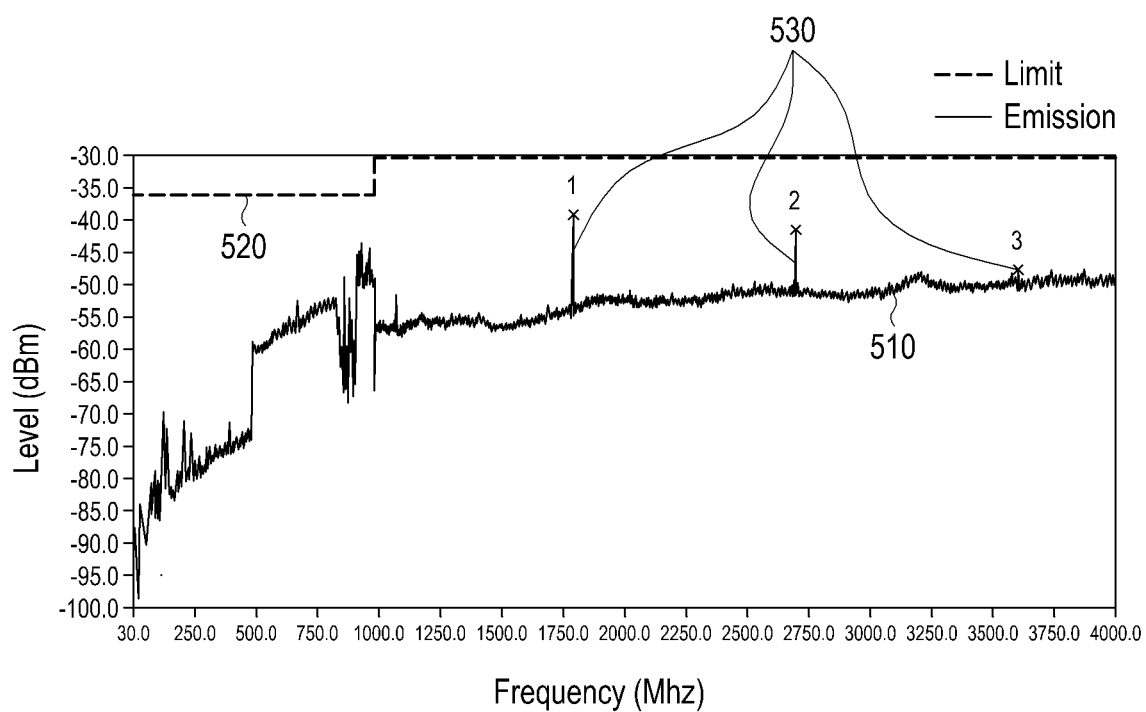
FIG. 5 is a view illustrating results of radio spurious emission (RSE) measurement upon signal transmission through an antenna and a switch on a frequency band according to an embodiment of the present disclosure.

FIG. 5 is a view illustrating results of RSE measurement upon transmission of signals through a switch and an antenna in a frequency band according to an embodiment of the present disclosure.

Referring to FIG. 5, the horizontal axis represents the frequency band Mhz, and the vertical axis represents the signal level (dBm). When a global system for mobile communication (GSM) 900 Mhz band signal is transmitted through the switch and the antenna (510), harmonic signals, such as a 2nd harmonic signal 1, a 3rd harmonic signal 2, and a 4th harmonic signal 3, may be generated. The harmonic signals 530 are required to have a preset signal strength or less upon transmission of communication signals to meet the specified RSE standards for ensuring communication performance. For example, the preset signal strength may be lower than −30 dBm 520.

When a Vpeak which is higher than a preset voltage, e.g., 55V, occurs in the switch (e.g., the switch 10), the 3rd harmonic signal 2 sharply grows, which may then serve as a RSE, leading to a failure to meet the RSE standards.

As set forth above, a high Vpeak switch, e.g., 55V or higher, may be used to have a less chance of occurrence of RSE in applying a switch to an antenna. However, such 55V or higher-Vpeak switch may cause high resistance when switching on, resulting in a deterioration of the antenna performance and total isotropic sensitivity (TIS) and total radiated power (TRP) performance.

Figure 6:
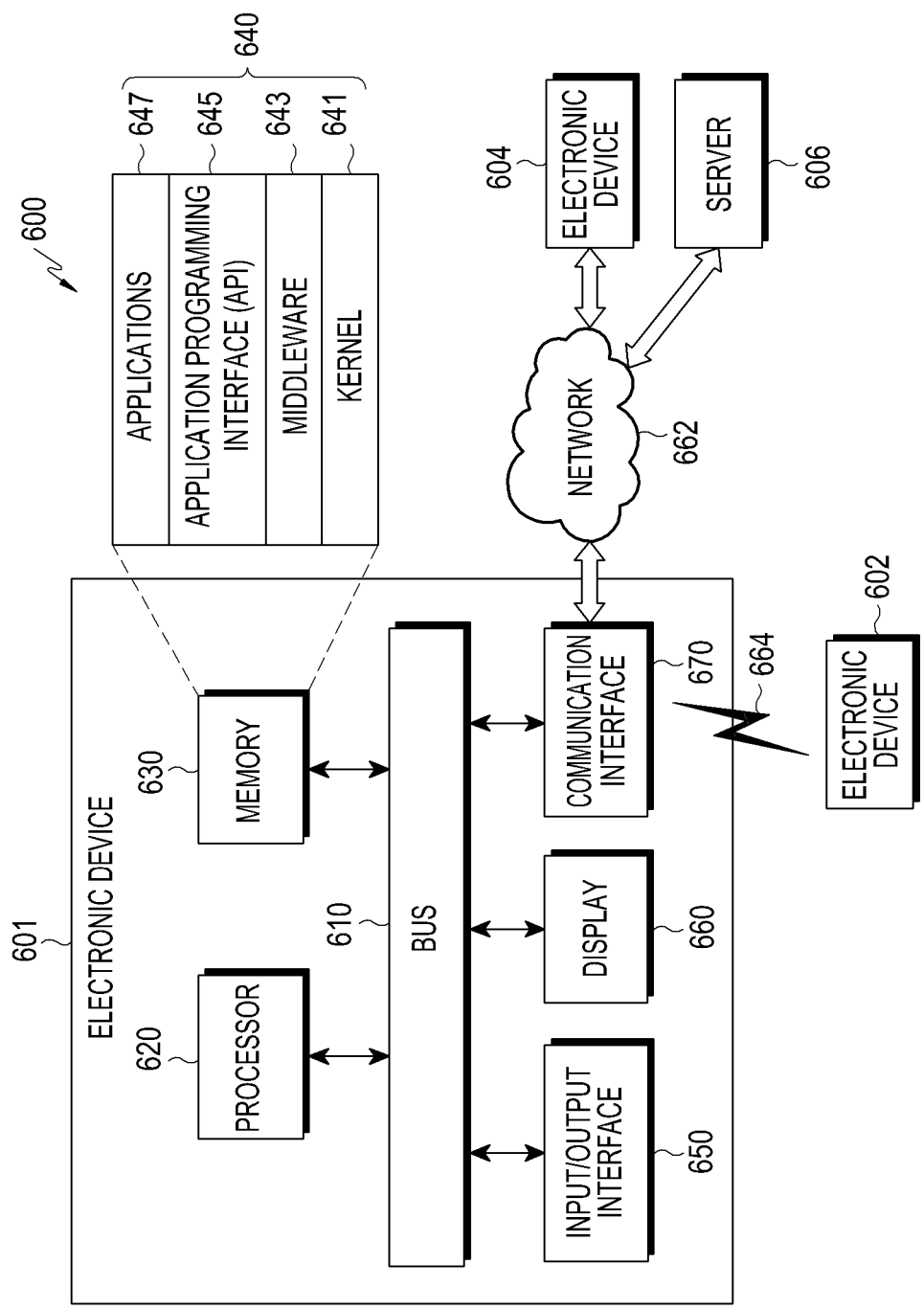
FIG. 6 is a block diagram illustrating a network environment including an electronic device according to an embodiment of the present disclosure.

FIG. 6 is a block diagram illustrating a network environment including an electronic device according to an embodiment of the present disclosure.

Referring to FIG. 6, an electronic device 601 is provided in a network environment 600 according to an embodiment of the present disclosure. The electronic device 601 may include a bus 610, a processor 620, a memory 630, an input/output interface 650, a display 660, and a communication interface 670. In some embodiments, the electronic device 601 may exclude at least one of the components or may add another component. The bus 610 may connect the components 620, 630, 650, 660 and 670 together and may include a circuit for delivering communications (e.g., control messages or data) between the components. The processor 620 may include one or more of a CPU, an AP, or a communication processor (CP). The processor 620 may perform control on at least one of the other components of the electronic device 601, and/or perform an operation or data processing relating to communication.

The memory 630 may include a volatile and/or non-volatile memory. For example, the memory 630 may store commands or data related to at least one other component of the electronic device 601. According to an embodiment of the present disclosure, the memory 630 may store software and/or a program 640. The program 640 may include, e.g., a kernel 641, middleware 643, an application programming interface (API) 645, and/or an application program (or "application") 647. At least a portion of the kernel 641, middleware 643, or API 645 may be denoted an operating system (OS). For example, the kernel 641 may control or manage system resources (e.g., the bus 610, the processor 620, or the memory 630) used to perform operations or functions implemented in other programs (e.g., the middleware 643, the API 645, or the application program 647). The kernel 641 may provide an interface that allows the middleware 643, the API 645, or the application 647 to access the individual components of the electronic device 601 to control or manage the system resources.

The middleware 643 may function as a relay to allow the API 645 or the application 647 to communicate data with the kernel 641, for example. The middleware 643 may process one or more task requests received from the application program 647 in order of priority. For example, the middleware 643 may assign a priority of using system resources (e.g., the bus 610, the processor 620, or the memory 630) of the electronic device 601 to at least one of the application programs 647 and process one or more task requests. The API 645 is an interface allowing the application 647 to control functions provided from the kernel 641 or the middleware 643. For example, the API 133 may include at least one interface or function (e.g., a command) for filing control, window control, image processing or text control. For example, the input/output interface 650 may transfer commands or data input from the user or other external device to other component(s) of the electronic device 601 or may output commands or data received from other component(s) of the electronic device 601 to the user or other external devices.

The display 660 may include, e.g., a liquid crystal display (LCD), a light emitting diode (LED) display, an organic light emitting diode (OLED) display, or a microelectromechanical system (MEMS) display, or other display. The display 660 may display, e.g., various contents (e.g., text, images, videos, icons, or symbols) to the user. The display 660 may include a touchscreen and may receive, e.g., a touch, gesture, proximity or hovering input using an electronic pen or a body portion of the user. For example, the communication interface 670 may set up communication between the electronic device 601 and an external electronic device (e.g., a first electronic device 602, a second electronic device 604, or a server 606). For example, the communication interface 670 may be connected with the network 662 through wireless or wired communication to communicate with the external electronic device (e.g., the second external electronic device 604 or server 606).

The wireless communication may include cellular communication which uses at least one of, e.g., long term evolution (LTE), long term evolution-advanced (LTE-A), code division multiple access (CDMA), wideband code division multiple access (WCDMA), universal mobile telecommunication system (UMTS), wireless broadband (WiBro), or global system for mobile communication (GSM). According to an embodiment of the present disclosure, the wireless communication may include at least one of, e.g., wireless-fidelity (Wi-Fi), light-fidelity (Li-Fi), bluetooth (BT), bluetooth low power (BLE), zigbee, near-field communication (NFC), magnetic secure transmission (MST), RF, or body area network (BAN) as denoted in element 664 of FIG. 6. According to an embodiment of the present disclosure, the wireless communication may include global navigation satellite system (GNSS). The GNSS may be, e.g., global positioning system (GPS), global navigation satellite system (Glonass), Beidou navigation satellite system (hereinafter, "Beidou") or Galileo, or the European global satellite-based navigation system. The terms "GPS" and the "GNSS" may be interchangeably used herein. The wired connection may include at least one of, e.g., universal serial bus (USB), high definition multimedia interface (HDMI), recommended standard (RS)-232, power line communication (PLC), or plain old telephone service (POTS). The network 662 may include at least one of telecommunication networks, e.g., a computer network (e.g., local area network (LAN) or wide area network (WAN)), Internet, or a telephone network.

The first and second external electronic devices 602 and 604 each may be a device of the same or a different type from the electronic device 601. According to an embodiment of the present disclosure, all or some of the operations executed on the electronic device 601 may by executed on another or multiple electronic devices (e.g., the first and second external electronic devices 602 and 604) or server 606. According to an embodiment of the present disclosure, when the electronic device 601 should perform some function or service automatically or at a request, the electronic device 601, instead of executing the function or service on its own or additionally, may request another device (e.g., the first and second external electronic devices 602 and 604 or the server 606) to perform at least some functions associated therewith. The other electronic device (e.g., the first and second external electronic devices 602 and 604 or the server 606) may execute the requested functions or additional functions and transfer a result of the execution to the electronic device 601. The electronic device 601 may provide a requested function or service by processing the received result as it is or additionally. To that end, a cloud computing, distributed computing, or client-server computing technique may be used, for example.

Figure 7:
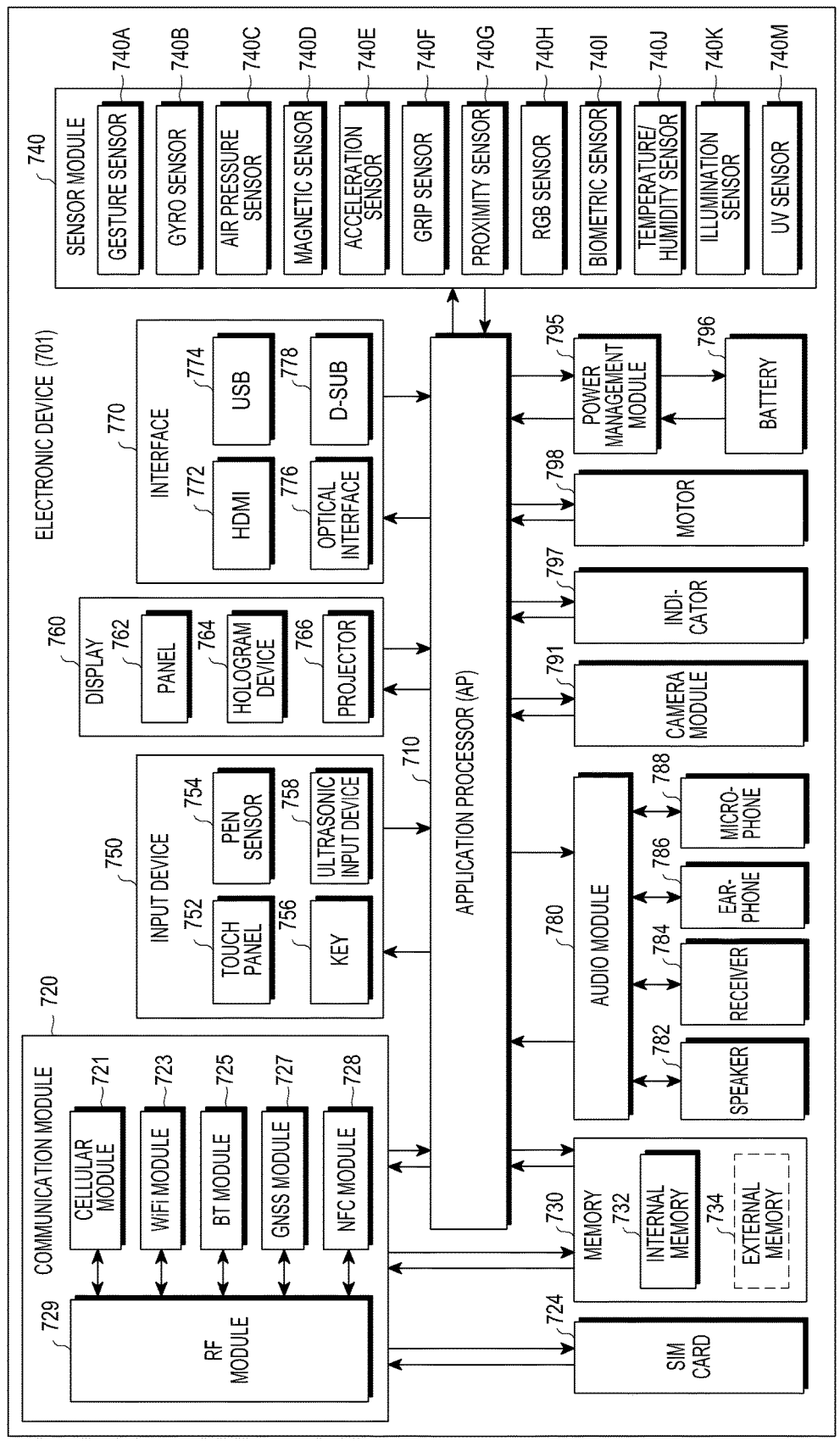
FIG. 7 is a block diagram illustrating an electronic device according to an embodiment of the present disclosure.

FIG. 7 is a block diagram illustrating an electronic device according to an embodiment of the present disclosure.

Referring to FIG. 7, an electronic device 701 may include the whole or part of, e.g., the electronic device 601 of FIG. 6. The electronic device 701 may include one or more processors (e.g., APs) 710, a communication module 720, a subscriber identification module (SIM) 724, a memory 730, a sensor module 740, an input device 750, a display 760, an interface 770, an audio module 780, a camera module 791, a power management module 795, a battery 796, an indicator 797, and a motor 798. The processor 710 may control multiple hardware and software components connected to the processor 710 by running, e.g., an OS or application programs, and the processor 210 may process and compute various data. The processor 710 may be implemented in, e.g., a system on chip (SoC). According to an embodiment of the present disclosure, the processor 710 may further include a graphic processing unit (GPU) and/or an image signal processor (ISP). The processor 710 may include at least some (e.g., a cellular module 721) of the components shown in FIG. 7. The processor 710 may load a command or data received from at least one of other components (e.g., a non-volatile memory) on a volatile memory, process the command or data, and store resultant data in the non-volatile memory.

The communication module 720 may have the same or similar configuration to the communication interface 670. The communication module 720 may include, e.g., the cellular module 721, a Wi-Fi module 723, a BT module 725, a GNSS module 727, a NFC module 728, and a RF module 729. The cellular module 721 may provide voice call, video call, text, or Internet services through, e.g., a communication network. The cellular module 721 may perform identification or authentication on the electronic device 701 in the communication network using the SIM 724 (e.g., the SIM card). According to an embodiment of the present disclosure, the cellular module 721 may perform at least some of the functions provided by the processor 710. According to an embodiment of the present disclosure, the cellular module 721 may include a CP. According to an embodiment of the present disclosure, at least some (e.g., two or more) of the cellular module 721, the Wi-Fi module 723, the BT module 725, the GNSS module 727, or the NFC module 728 may be included in a single integrated circuit (IC) or an IC package. The RF module 729 may communicate data, e.g., communication signals (e.g., RF signals). The RF module 729 may include, e.g., a transceiver, a power amp module (PAM), a frequency filter, a low noise amplifier (LNA), or an antenna. According to an embodiment of the present disclosure, at least one of the cellular module 721, the Wi-Fi module 723, the BT module 725, the GNSS module 727, or the NFC module 728 may communicate RF signals through a separate RF module. The subscription identification module 724 may include, e.g., a card including a SIM, or an embedded SIM, and may contain unique identification information (e.g., an integrated circuit card identifier (ICCID) or subscriber information (e.g., an international mobile subscriber identity (IMSI)).

The memory 730 (e.g., the memory 630) may include, e.g., an internal memory 732 or an external memory 734. The internal memory 732 may include at least one of, e.g., a volatile memory (e.g., a dynamic RAM (DRAM), a static RAM (SRAM), a synchronous dynamic RAM (SDRAM), etc.) or a non-volatile memory (e.g., a one-time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash, or a NOR flash), a hard drive, or solid-state drive (SSD). The external memory 734 may include a flash drive, e.g., a compact flash (CF) memory, a secure digital (SD) memory, a micro-SD memory, a min-SD memory, an extreme digital (xD) memory, a multi-media card (MMC), or a Memory Stick™. The external memory 734 may be functionally or physically connected with the electronic device 701 via various interfaces.

For example, the sensor module 740 may measure a physical quantity or detect a motion state of the electronic device 701, and the sensor module 240 may convert the measured or detected information into an electrical signal. The sensor module 740 may include at least one of, e.g., a gesture sensor 740A, a gyro sensor 740B, an atmospheric pressure sensor 740C, a magnetic sensor 740D, an acceleration sensor 740E, a grip sensor 740F, a proximity sensor 740G, a color sensor 740H (e.g., a red-green-blue (RGB) sensor), a bio sensor 740I, a temperature/humidity sensor 740J, an illumination sensor 740K, or an ultra violet (UV) sensor 740M. Additionally or alternatively, the sensing module 740 may include, e.g., an e-nose sensor, an electromyography (EMG) sensor, an electroencephalogram (EEG) sensor, an electrocardiogram (ECG) sensor, an infrared (IR) sensor, an iris sensor, or a finger print sensor. The sensor module 740 may further include a control circuit for controlling at least one or more of the sensors included in the sensing module. According to an embodiment of the present disclosure, the electronic device 701 may further include a processor configured to control the sensor module 740 as part of the processor 710 or separately from the processor 710, and the electronic device 701 may control the sensor module 740 while the processor 710 is in a sleep mode.

The input unit 750 may include, e.g., a touch panel 752, a (digital) pen sensor 754, a key 756, or an ultrasonic input device 758. The touch panel 752 may use at least one of capacitive, resistive, infrared, or ultrasonic methods. The touch panel 752 may further include a control circuit. The touch panel 752 may further include a tactile layer and may provide a user with a tactile reaction. The (digital) pen sensor 754 may include, e.g., a part of a touch panel or a separate sheet for recognition. The key 756 may include e.g., a physical button, optical key or key pad. The ultrasonic input device 758 may sense an ultrasonic wave generated from an input tool through a microphone (e.g., the microphone 788) to identify data corresponding to the sensed ultrasonic wave.

The display 760 (e.g., the display 660) may include a panel 762, a hologram device 764, a projector 766, and/or a control circuit for controlling the same. The panel 762 may be implemented to be flexible, transparent, or wearable. The panel 762, together with the touch panel 752, may be configured in one or more modules. According to an embodiment of the present disclosure, the panel 762 may include a pressure sensor (or pose sensor) that may measure the strength of a pressure by the user's touch. The pressure sensor may be implemented in a single body with the touch panel 752 or may be implemented in one or more sensors separate from the touch panel 752. The hologram device 764 may make three dimensional (3D) images (holograms) in the air by using light interference. The projector 766 may display an image by projecting light onto a screen. The screen may be, for example, located inside or outside of the electronic device 701. The interface 770 may include e.g., a HDMI 772, a USB 774, an optical interface 776, or a D-subminiature (D-sub) 778. The interface 770 may be included in e.g., the communication interface 670 shown in FIG. 6. Additionally or alternatively, the interface 770 may include a mobile high-definition link (MHL) interface, a SD card/multimedia card (MMC) interface, or infrared data association (IrDA) standard interface.

The audio module 780 may convert, e.g., a sound signal into an electrical signal and vice versa. At least a part of the audio module 780 may be included in e.g., the input/output interface 650 as shown in FIG. 6. The audio module 780 may process sound information input or output through e.g., a speaker 782, a receiver 784, an earphone 786, or a microphone 788.

The camera module 791 may be a device for capturing still images and videos, and may include, according to an embodiment of the present disclosure, one or more image sensors (e.g., front and back sensors), a lens, an ISP, or a flash such as an LED or xenon lamp. The power manager module 795 may manage power of the electronic device 701, for example. According to an embodiment of the present disclosure, the power manager module 795 may include a power management integrated circuit (PMIC), a charger IC, or a battery or fuel gauge. The PMIC may have a wired and/or wireless recharging scheme. The wireless charging scheme may include e.g., a magnetic resonance scheme, a magnetic induction scheme, or an electromagnetic wave based scheme, and an additional circuit, such as a coil loop, a resonance circuit, a rectifier, or the like may be added for wireless charging. The battery gauge may measure an amount of remaining power of the battery 796, a voltage, a current, or a temperature while the battery 796 is being charged. The battery 796 may include, e.g., a rechargeable battery or a solar battery.

The indicator 797 may indicate a particular state of the electronic device 701 or a part (e.g., the processor 710) of the electronic device, including e.g., a booting state, a message state, or recharging state. The motor 798 may convert an electric signal to a mechanical vibration and may generate a vibrational or haptic effect. The electronic device 701 may include a mobile TV supporting device (e.g., a GPU) that may process media data as per, e.g., digital multimedia broadcasting (DMB), digital video broadcasting (DVB), or mediaFlo™ standards. Each of the aforementioned components of the electronic device may include one or more parts, and a name of the part may vary with a type of the electronic device. According to various embodiments, the electronic device (e.g., the electronic device 701) may exclude some elements or include more elements, or some of the elements may be combined into a single entity that may perform the same function as by the elements before combined.

Figure 8:
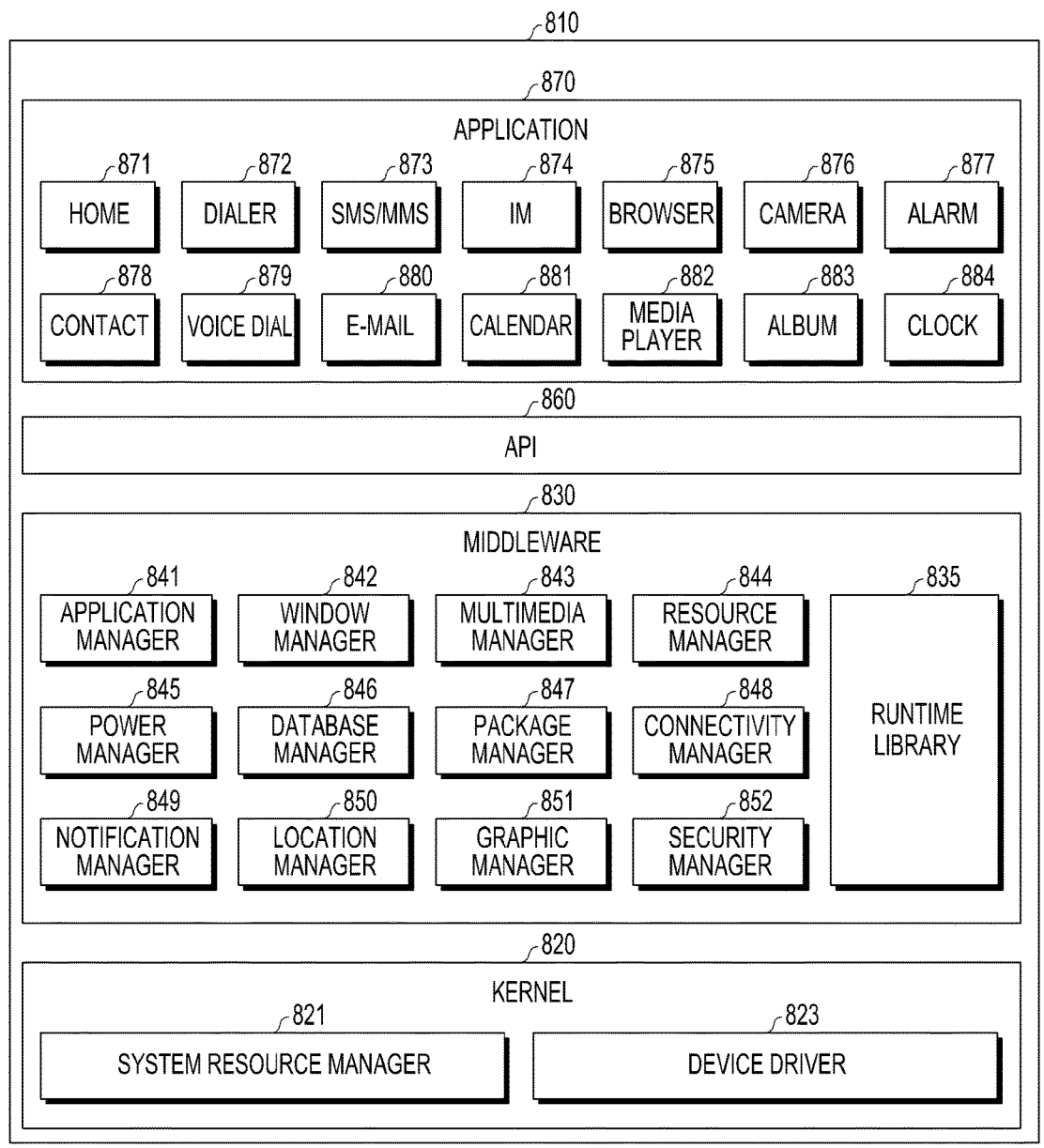
FIG. 8 is a block diagram illustrating a program module according to an embodiment of the present disclosure.

FIG. 8 is a block diagram illustrating a program module according to an embodiment of the present disclosure.

Referring to FIG. 8, a program module 810 (e.g., the program 740) may include an OS controlling resources related to the electronic device (e.g., the electronic device 601) and/or various applications (e.g., the AP 710) driven on the OS. The OS may include, e.g., Android™, iOS™, Windows™, Symbian™, Tizen™, or Bada™. Referring to FIG. 8, the program module 810 may include a kernel 820 (e.g., the kernel 141), middleware 830 (e.g., the middleware 643), an API 860 (e.g., the API 645), and/or an application 870 (e.g., the application program 647). At least a part of the program module 810 may be preloaded on the electronic device or may be downloaded from an external electronic device (e.g., the first and second external electronic devices 602 and 604 or the server 606).

The kernel 820 may include, e.g., a system resource manager 821 or a device driver 823. The system resource manager 821 may perform control, allocation, or recovery of system resources. According to an embodiment of the present disclosure, the system resource manager 821 may include a process managing unit, a memory managing unit, or a file system managing unit. The device driver 823 may include, e.g., a display driver, a camera driver, a BT driver, a shared memory driver, a USB driver, a keypad driver, a Wi-Fi driver, an audio driver, or an inter-process communication (IPC) driver. The middleware 830 may provide various functions to the application 870 through the API 860 so that the application 870 may use limited system resources in the electronic device or provide functions jointly required by applications 870. According to an embodiment of the present disclosure, the middleware 830 may include at least one of a runtime library 835, an application manager 841, a window manager 842, a multimedia manager 843, a resource manager 844, a power manager 845, a database manager 846, a package manager 847, a connectivity manager 848, a notification manager 849, a location manager 850, a graphic manager 851, or a security manager 852.

The runtime library 835 may include a library module used by a compiler in order to add a new function through a programming language while, e.g., the application 870 is being executed. The runtime library 835 may perform input/output management, memory management, or arithmetic function processing. The application manager 841 may manage the life cycle of, e.g., the applications 870. The window manager 842 may manage GUI resources used on the screen. The multimedia manager 843 may grasp formats necessary to play media files and use a codec appropriate for a format to perform encoding or decoding on media files. The resource manager 844 may manage the source code or memory space of the application 870. The power manager 845 may manage, e.g., the capacity, temperature, or power of the battery, and determine or provide power information necessary for operating the electronic device using corresponding information of such pieces of information. According to an embodiment of the present disclosure, the power manager 845 may interwork with a basic input/output system (BIOS). The database manager 846 may generate, search, or vary a database to be used in the applications 870. The package manager 847 may manage installation or update of an application that is distributed in the form of a package file.

The connectivity manager 848 may manage, e.g., wireless connectivity. The notification manager 849 may provide an event, e.g., arrival message, appointment, or proximity alert, to the user. The location manager 850 may manage, e.g., locational information on the electronic device. The graphic manager 851 may manage, e.g., graphic effects to be offered to the user and their related user interface. The security manager 852 may provide system security or user authentication, for example. According to an embodiment of the present disclosure, the middleware 830 may include a telephony manager for managing the voice or video call function of the electronic device or a middleware module able to form a combination of the functions of the above-described elements. According to an embodiment of the present disclosure, the middleware 830 may provide a module specified according to the type of OS. The middleware 830 may dynamically omit some existing components or add new components. The API 860 may be a set of, e.g., API programming functions and may have different configurations depending on OSs. For example, in the case of Android or iOS, one API set may be provided per platform, and in the case of Tizen, two or more API sets may be offered per platform.

The application 870 may include an application that may provide, e.g., a home 871, a dialer 872, a short message service (SMS)/multimedia message service (MMS) 873, an instant message (IM) 874, a browser 875, a camera 876, an alarm 877, a contact 878, a voice dial 879, an email 880, a calendar 881, a media player 882, an album 883, or a clock 884, a health-care (e.g., measuring the degree of workout or blood sugar), or provision of environmental information (e.g., provision of air pressure, moisture, or temperature information). According to an embodiment of the present disclosure, the application 870 may include an information exchanging application supporting information exchange between the electronic device and an external electronic device. Examples of the information exchange application may include, but is not limited to, a notification relay application for transferring specific information to the external electronic device, or a device management application for managing the external electronic device. For example, the notification relay application may transfer notification information generated by other application of the electronic device to the external electronic device or receive notification information from the external electronic device and provide the received notification information to the user. For example, the device management application may install, delete, or update a function (e.g., turn-on/turn-off the external electronic device (or some elements) or adjusting the brightness (or resolution) of the display) of the external electronic device communicating with the electronic device or an application operating on the external electronic device. According to an embodiment of the present disclosure, the application 870 may include an application (e.g., a healthcare application of a mobile medical device) designated according to an attribute of the external electronic device. According to an embodiment of the present disclosure, the application 870 may include an application received from the external electronic device. At least a portion of the program module 810 may be implemented (e.g., executed) in software, firmware, hardware (e.g., the processor 710), or a combination of at least two or more thereof and may include a module, program, routine, command set, or process for performing one or more functions.

According to an embodiment of the present disclosure, an electronic device may include a multiband antenna. The electronic device may select any one band from among multiple bands that the multiband antenna may provide through antenna switches, and the electronic device may transmit or receive wireless signals using the selected band.

According to an embodiment of the present disclosure, an electronic device may comprise a housing, a memory, an antenna for multi-band communication, a communication unit processing a RF signal using the antenna, a switching unit including a first switch connected with a first branch point of the antenna, a second switch connected between the first switch and a second branch point of the antenna, a third switch connected with a third branch point of the antenna, a fourth switch connected between the second branch point and the third switch, a fifth switch connected between a first node between the first switch and the second switch and a ground, and a sixth switch connected between a second node between the third switch and the fourth switch and the ground, and a processor electrically connected with the memory, the communication unit, and the switching unit, wherein the memory stores instructions executed to enable the processor to perform control to turn on the first switch, the second switch, and the sixth switch and turn off the third switch, the fourth switch, and the fifth switch to form a first path or to turn off the first switch, the second switch, and the sixth switch and turn on the third switch, the fourth switch, and the fifth switch to form a second path.

According to an embodiment of the present disclosure, the first switch, the second switch, the third switch, the fourth switch, the fifth switch, and the sixth switch may be included in at least one switch module.

According to an embodiment of the present disclosure, the instructions may be configured to enable the processor to perform control to turn on the first switch, the second switch, and the sixth switch and turn off the third switch, the fourth switch, and the fifth switch to form a first path corresponding to a first band as the first band is selected from among the multiple bands, and the instructions may be configured to enable the processor to perform control to turn off the first switch, the second switch, and the sixth switch and turn on the third switch, the fourth switch, and the fifth switch to form a second path corresponding to a second band as the second band is selected from among the multiple bands.

According to an embodiment of the present disclosure, the first switch, the second switch, the third switch, the fourth switch, the fifth switch, and the sixth switch each may include at least one or more FET devices.

According to an embodiment of the present disclosure, the communication unit may include a transceiver modulating and demodulating the RF signal, a PAM amplifying the modulated or demodulated RF signal, and a front-end module (FEM) splitting and filtering amplified transmit signal and receive signal, transferring the transmit signal to the antenna, and receiving the receive signal through the antenna.

According to an embodiment of the present disclosure, the electronic device may further comprise a matching circuit between the communication unit and the antenna.

According to an embodiment of the present disclosure, the first band and the second band may include any one of a 700 Mhz band, an 850 Mhz band, a 900 Mhz band, a 1.8 Ghz band, a 1.9 Ghz band, a 2.1 Ghz band, and a 2.6 Ghz band, and the first band may differ from the second band.

According to an embodiment of the present disclosure, the switching unit may further include a seventh switch connected with a fourth branch point of the antenna, an eighth switch connected between the seventh switch and the second branch point of the antenna, a ninth switch connected with a fifth branch point of the antenna, a tenth switch connected between the second branch point and the ninth switch, an eleventh switch connected between a third node between the seventh switch and the eighth switch and the ground, and a twelfth switch connected between a fourth node between the ninth switch and the tenth switch and the ground. The instructions may be configured to enable the processor to perform control to turn on the seventh switch, the eighth switch, and the twelfth switch and turn off the ninth switch, the tenth switch, and the eleventh switch to form a third path or to turn off the seventh switch, the eighth switch, and the twelfth switch and turn on the ninth switch, the tenth switch, and the eleventh switch to form a fourth path.

According to an embodiment of the present disclosure, the instructions may be configured to enable the processor to perform control to turn on the seventh switch, the eighth switch, and the twelfth switch and turn off the ninth switch, the tenth switch, and the eleventh switch to form the third path corresponding to a third band through the antenna as the third band is selected from among the multiple bands, and the instructions may be configured to enable the processor to perform control to turn off the seventh switch, the eighth switch, and the twelfth switch and turn on the ninth switch, the tenth switch, and the eleventh switch to form the fourth path corresponding to a fourth band through the antenna as the fourth band is selected from among the multiple bands.

According to an embodiment of the present disclosure, the seventh switch, the eighth switch, the ninth switch, the tenth switch, the eleventh switch, and the twelfth switch each may include at least one or more FET devices.

According to an embodiment of the present disclosure, the third band and the fourth band may differ from the first band and the second band and may differ from each other. The third band and the fourth band may include any one of a 700 Mhz band, an 850 Mhz band, a 900 Mhz band, a 1.8 Ghz band, a 1.9 Ghz band, a 2.1 Ghz band, and a 2.6 Ghz band.

Figure 9:
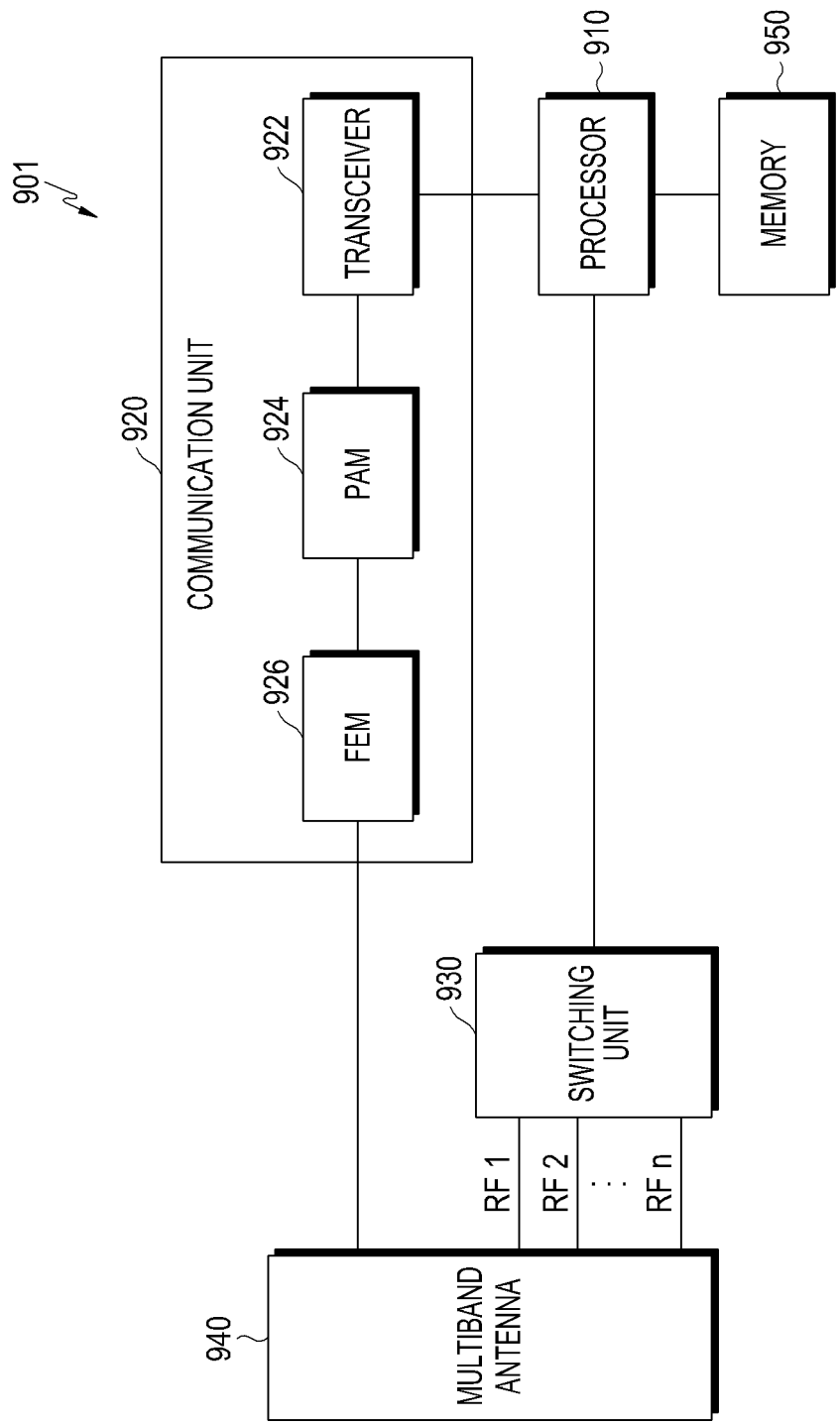
FIG. 9 is a view illustrating an electronic device having a multiband antenna according to an embodiment of the present disclosure.

FIG. 9 is a view illustrating an electronic device having a multiband antenna according to an embodiment of the present disclosure.

According to an embodiment of the present disclosure, an electronic device of FIG. 9 may include the whole or part of the electronic device 601 of FIG. 6 or the electronic device 701 of FIG. 7.

Referring to FIG. 9, an electronic device 901 may include a processor 910, a communication unit 920, a switching unit 930, and a multiband antenna 940.

The processor 910 may perform the overall control operations on the electronic device 901 and may control wireless transmission/reception operation. According to an embodiment of the present disclosure, the processor 910 may control the switching unit 930 to set an electrical path of a band selected for wireless transmission/reception among the multiple bands in the multiband antenna 940.

The communication unit 920 may transmit or receive communication signals (e.g., RF signals). The communication unit 920 may include a transceiver 922, a PAM 924, and a FEM 926. Although not shown, the communication unit 920 may further include components necessary for transmission or reception of RF signals, such as a matching circuit.

The transceiver 922 may modulate RF signals to be transmitted or demodulate RF signals to be received. The PAM 924 may amplify the modulated signals or demodulated signals. The FEM 926 may split and filter the amplified transmit/receive signals, and the FEM 926 may deliver transmit signals from the communication unit 920 to the multiband antenna 940 and receive signals received through the multiband antenna 940 to the communication unit 920.

The switching unit 930 may include a plurality of switches. Each of the plurality of switches perform switching operations under the control of the processor 910. An electrical path corresponding to a band selected from multiple bands that may be provided from the multiband antenna 940 may be formed according to the switching operation of the plurality of switches.

The multiband antenna 940 may include a plurality of branch points, e.g., a first to nth branch points RF1, RF2, . . . , RFn each of which corresponds to a respective one of the multiple bands. According to an embodiment of the present disclosure, the position of the first to nth branch points may be previously designated depending on the path corresponding to the antenna length at which emission may occur for each of the multiple bands. According to an embodiment of the present disclosure, as the length of the path increases, its corresponding frequency band may be reduced, and as the length of the path reduces, its corresponding frequency band may be increased.

According to an embodiment of the present disclosure, when the first branch point and second branch point corresponding to a first band selected from among the multiple bands by the switching unit 930 are connected together, current from the FEM 926 may flow through a first path which is made by the connection between the first branch point and the second branch point, so that a first band of signal may be emitted from the multiband antenna 940.

According to an embodiment of the present disclosure, the electronic device 901 may further include a memory 950. The memory 950 may store switching information (per-band switching information) corresponding to each band of the multi-bands. The per-band switching information may include on/off information about at least one or more switches that may connect at least one or more branch points corresponding to a band selected from among the plurality of branch points of the multiband antenna. When the switching unit 930 includes a first switch to a sixth switch, the memory 950 may store instructions that, when executed, enable the processor 910 to turn on the first, second, and sixth switches and turn off the third, fourth, and fifth switches to form a first path or to turn off the first, second, and sixth switches and turn on the third, fourth, and fifth switches to form a second path.

Figure 10:
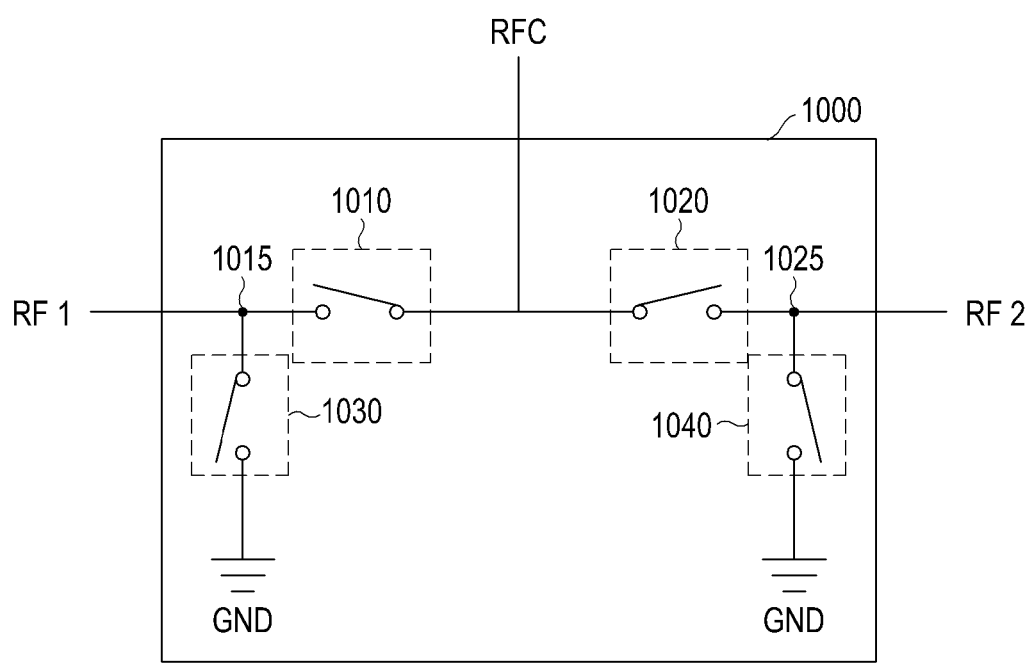
FIG. 10 is a view illustrating a switching unit according to an embodiment of the present disclosure.

FIG. 10 is a view illustrating a switching unit according to an embodiment of the present disclosure.

According to an embodiment of the present disclosure, the switching unit of FIG. 10 may include the whole or part of the switching unit 930 of FIG. 9.

Referring to FIG. 10, a switching unit 1000 may include a first terminal RFC connected to a first branch point of a multiband antenna (e.g., the multiband antenna 940), a second terminal RF1 connected to a second branch point of the multiband antenna 940, and a third terminal RF2 connected to a third branch point of the multiband antenna 940. The first terminal RFC may be a pole, and the second and third terminals, each, may be a throw.

According to an embodiment of the present disclosure, the switching unit 1000 may include a first switch 1010, a second switch 1020, a third switch 1030, and a fourth switch 1040. The first switch 1010 may be connected between the first branch point and the second branch point to turn on or off. The second switch 1020 may be connected between the second branch point and the third branch point to turn on or off. The third switch 1030 may turn on or off between a first node 1015 between the first branch point and the first switch 1010 and a ground GND. The fourth switch 1040 may turn on or off between a second node 1025 between the third branch point and the second switch 1020 and the ground GND. According to an embodiment of the present disclosure, the processor (e.g., the processor 910 of FIG. 9) may control the switching unit 1000 (e.g., the switching unit 930) to set a band necessary for wireless transmission/reception among the multiple bands.

Figure 11A:
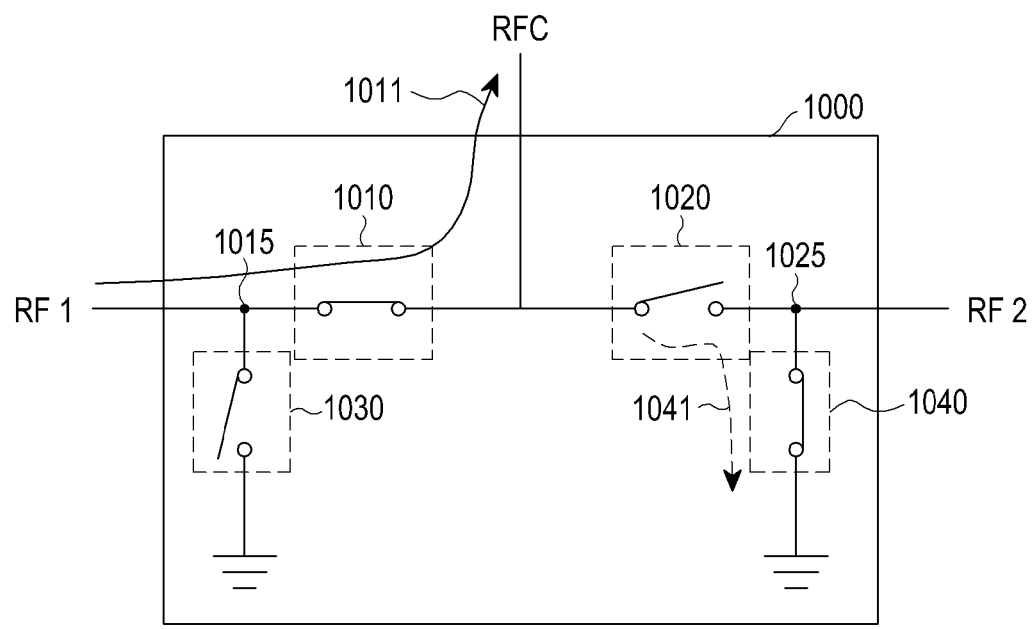
FIGS. 11A and 11B are views illustrating operations of a switching unit according to an embodiment of the present disclosure.
Figure 11B:
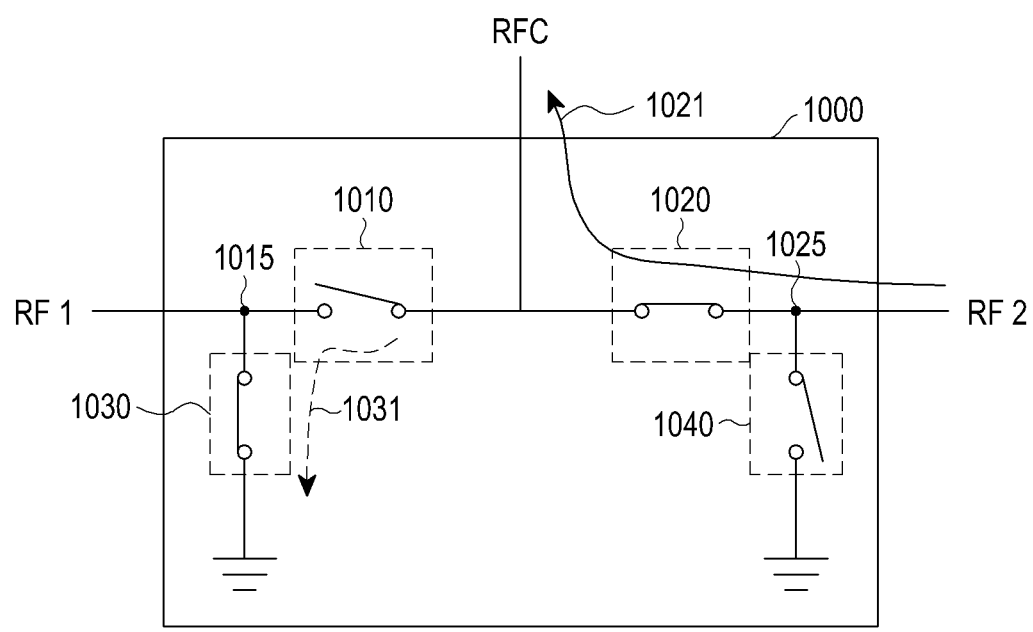

FIGS. 11A and 11B are views illustrating operations of a switching unit according to an embodiment of the present disclosure.

According to an embodiment of the present disclosure, the switching unit 1000 may include the whole or part of the switching unit 930 of FIG. 9.

Referring to FIG. 11A, a processor (e.g., the processor 910 of FIG. 9) may control a first switch 1010 to turn on, a second switch 1020 to turn off, a third switch 1030 to turn off, and a fourth switch 1040 to turn on.

As the first switch 1010 turns on, a first branch point and a second branch point of a multiband antenna may be connected together. As the second switch 1020 turns off, a third branch point and the second branch point of the multiband antenna may be disconnected.

As the first branch point and second branch point of the multiband antenna 940 are connected together, a signal provided to the multiband antenna 940 may flow along a first path 1011 from the first branch point to the second branch point, emitting a first signal. Although the second switch 1020 turns off, a predetermined voltage may be applied to the second switch 1020 by, e.g., parasitic capacitance. When the Vpeak exceeds a predetermined value, harmonics may be generated and emitted together with the first signal. As a fourth switch 1040 turns off, the second node 1025 and the ground may be connected together, and the signal 1041 by the voltage applied to the second switch 1020 may be grounded and thus removed, preventing harmonics from being generated.

Referring to FIG. 11B, the processor (e.g., the processor 910 of FIG. 9) may control the first switch 1010 to turn off, the second switch 1020 to turn on, the third switch 1030 to turn on, and the fourth switch 1040 to turn off.

As the second switch 1020 turns on, the third branch point and the second branch point of the multiband antenna 940 may be connected together. As the first switch 1010 turns off, the first branch point and the second branch point of the multiband antenna may be disconnected.

As the third branch point and second branch point of the multiband antenna 940 are connected together, a signal provided to the multiband antenna 940 may flow along a second path 1021 from the third branch point to the second branch point, emitting a second signal. Although the first switch 1010 turns off, a predetermined voltage may be applied to the first switch 1010 by, e.g., parasitic capacitance. When the Vpeak exceeds a predetermined value, harmonics may be generated and emitted together with the second signal. As the third switch 1030 turns on, the first node 1015 and the ground may be connected together, and the signal 1031 by the voltage applied to the first switch 1010 may be grounded and thus removed, preventing harmonics from being generated.

Figure 12:
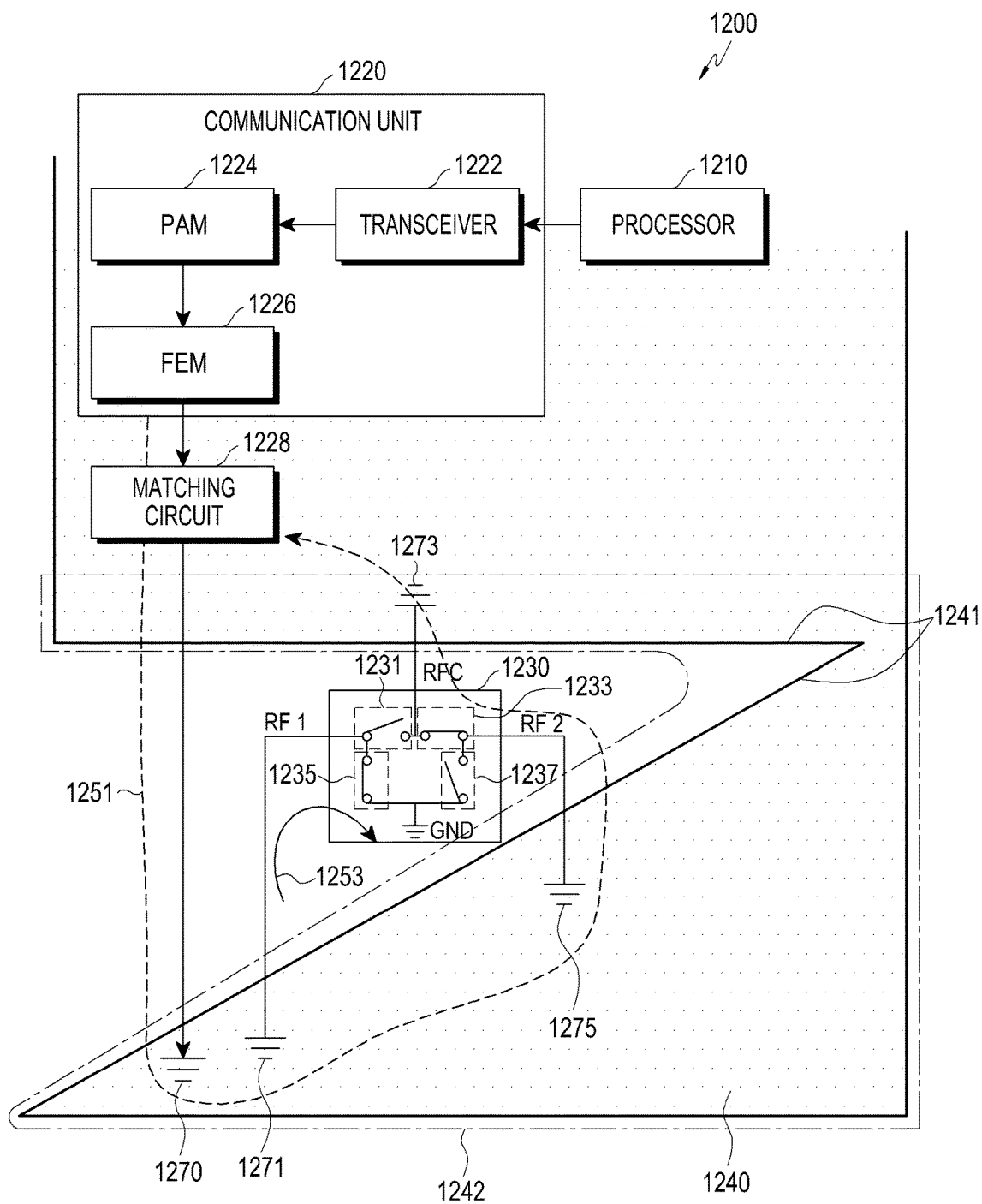
FIG. 12 is a view illustrating an example of placing a switching unit according to an embodiment of the present disclosure.

FIG. 12 is a view illustrating an example of placing a switching unit according to an embodiment of the present disclosure.

According to an embodiment of the present disclosure, an electronic device of FIG. 12 may include the whole or part of the electronic device 601 of FIG. 6, the electronic device 701 of FIG. 7, or the electronic device 901 of FIG. 9.

Referring to FIG. 12, an electronic device 1200 includes a multiband antenna 1242 may be part of a PCB 1240 and may be an antenna including a slit unit 1241. A switching unit 1230 may be disposed in a physical space formed by the slit unit 1241 of the multiband antenna 1242. The electronic device 1200 further includes a processor 1210, a communication unit 1220, a matching unit 1228. The communication unit 1220 includes a transceiver 1222, a PAM 1224 and a FEM 1226.

The multiband antenna 1242 may be connected (1270) with the FEM 1226 through a matching circuit 1228, and a second branch point 1273 may be connected with at least one of a first branch point 1271 and a third branch point 1275 through the switching unit 1230. Each of the first to third branch points 1271, 1273, and 1275 may previously be designated corresponding to a respective one of multiple bands.

The switching unit 1230 may include a first switch 1231, a second switch 1233, a third switch 1235, and a fourth switch 1237.

According to an embodiment of the present disclosure, a processor 1210 (e.g., the processor 620 of FIG. 6 or the processor 710 of FIG. 7) may control the first switch 1231 to turn off, the second switch 1233 to turn on, the third switch 1235 to turn on, and the fourth switch 1237 to turn off. According to an embodiment of the present disclosure, a processor 1210 (e.g., the processor 620 of FIG. 6 or the processor 710 of FIG. 7) may control the first switch 1231 to turn off, the second switch 1233 to turn on, the third switch 1235 to turn on, and the fourth switch 1237 to turn off.

As the second switch 1233 turns on, the third branch point 1275 and the second branch point 1273 of the multiband antenna 1242 may be connected together. As the first switch 1231 turns off, the first branch point 1271 and the second branch point 1273 of the multiband antenna 1242 may be disconnected.

As the third branch point 1275 and second branch point 1273 of the multiband antenna 1242 are connected together, a signal provided to the multiband antenna 1242 may flow along a second path 1251 from the third branch point 1275 to the second branch point 1273, emitting a second signal. Although the first switch 1231 turns off, a predetermined voltage may be applied to the first switch 1231 by, e.g., parasitic capacitance. When the Vpeak exceeds an allowed value, harmonics may be generated, influencing the emission of the second signal. As the third switch 1235 turns on, the first switch 1231 and the ground may be connected together, and the signal by the voltage applied to the first switch 1231 may be grounded and thus removed, preventing harmonics from being generated.

According to an embodiment of the present disclosure, as the signal by the voltage applied to the first switch 1231 is grounded, a parasitic loop 1253 may be generated. The parasitic loop may be generated in a reverse direction of the second path 1251, attenuating or affecting the signal that flows from the third branch point 1275 to the second branch point 1273 along the second path 1251, and resultantly influencing the emission of a second-band signal from the multiband antenna 1242. According to an embodiment of the present disclosure, a switch may be added to remove the parasitic loop.

According to an embodiment of the present disclosure, a method for switching in an electronic device comprising an antenna for multiband communication and a switching unit, the switching unit including a first switch connected with a first branch point of the antenna, a second switch connected between the first switch and a second branch point of the antenna, a third switch connected with a third branch point of the antenna, a fourth switch connected between the second branch point and the third switch, a fifth switch connected between a first node between the first switch and the second switch and a ground, and a sixth switch connected between a second node between the third switch and the fourth switch and the ground may comprise turning on the first switch, the second switch, and the sixth switch and turning off the third switch, the fourth switch, and the fifth switch to form a first path corresponding to a first band as the first band is selected from among the multiple bands and turning off the first switch, the second switch, and the sixth switch and turning on the third switch, the fourth switch, and the fifth switch to form a second path corresponding to a second band as the second band is selected from among the multiple bands.

According to an embodiment of the present disclosure, the first switch, the second switch, the third switch, the fourth switch, the fifth switch, and the sixth switch each may include at least one or more FET devices.

According to an embodiment of the present disclosure, the first band and the second band may include any one of a 700 Mhz band, an 850 Mhz band, a 900 Mhz band, a 1.8 Ghz band, a 1.9 Ghz band, a 2.1 Ghz band, and a 2.6 Ghz band, and the first band may differ from the second band.

According to an embodiment of the present disclosure, the switching unit further may include a seventh switch connected with a fourth branch point of the antenna, an eighth switch connected between the seventh switch and the second branch point of the antenna, a ninth switch connected with a fifth branch point of the antenna, a tenth switch connected between the second branch point and the ninth switch, an eleventh switch connected between a third node between the seventh switch and the eighth switch and the ground, and a twelfth switch connected between a fourth node between the ninth switch and the tenth switch and the ground. The method may further comprise turning on the seventh switch, the eighth switch, and the twelfth switch and turning off the ninth switch, the tenth switch, and the eleventh switch to form a third path corresponding to a third band through the antenna as the third band is selected from among the multiple bands and turning off the seventh switch, the eighth switch, and the twelfth switch and turning on the ninth switch, the tenth switch, and the eleventh switch to form a fourth path corresponding to a fourth band through the antenna as the fourth band is selected from among the multiple bands.

According to an embodiment of the present disclosure, the seventh switch, the eighth switch, the ninth switch, the tenth switch, the eleventh switch, and the twelfth switch each may include at least one or more FET devices.

According to an embodiment of the present disclosure, the third band and the fourth band may differ from the first band and the second band and may differ from each other. The third band and the fourth band may include any one of a 700 Mhz band, an 850 Mhz band, a 900 Mhz band, a 1.8 Ghz band, a 1.9 Ghz band, a 2.1 Ghz band, and a 2.6 Ghz band.

Figure 13:
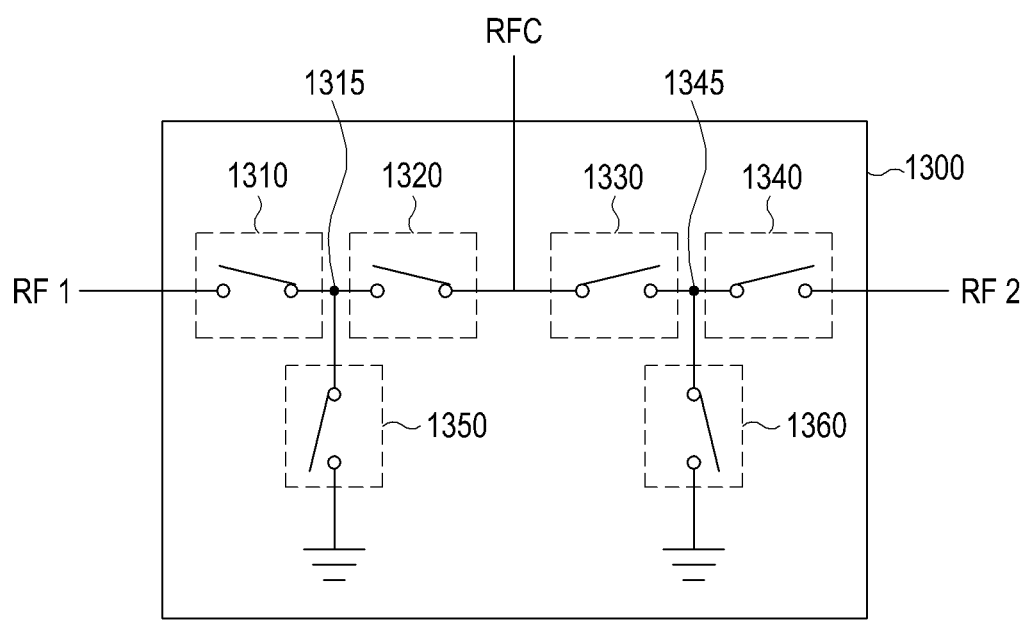
FIG. 13 is a view illustrating a switching unit according to an embodiment of the present disclosure.

FIG. 13 is a view illustrating a switching unit according to an embodiment of the present disclosure.

According to an embodiment of the present disclosure, the switching unit of FIG. 13 may include the whole or part of the switching unit 1230 of FIG. 12.

Referring to FIG. 13, a switching unit 1300 may include a first terminal RFC connected to a first branch point of a multiband antenna, a second terminal RF1 connected to a second branch point of the multiband antenna, and a third terminal RF2 connected to a third branch point of the multiband antenna. The first terminal RFC may be a pole, and the second and third terminals, each, may be a throw.

According to an embodiment of the present disclosure, the switching unit 1300 may include a first switch 1310, a second switch 1320, a third switch 1330, a fourth switch 1340, a fifth switch 1350, and a sixth switch 1360. The first switch 1310 may be connected with the first branch point of the multiband antenna. The second switch 1320 may be connected between the first switch 1310 and the second branch point of the multiband antenna. The third switch 1330 may be connected with the third branch point of the multiband antenna. The fourth switch 1340 may be connected between the third switch 1330 and the second branch point of the multiband antenna. The fifth switch 1350 may be connected between the first node 1315 between the first switch 1310 and the second switch 1320 and the ground. The sixth switch 1360 may be connected between the second node 1345 between the third switch 1330 and the fourth switch 1340 and the ground.

Figure 14A:
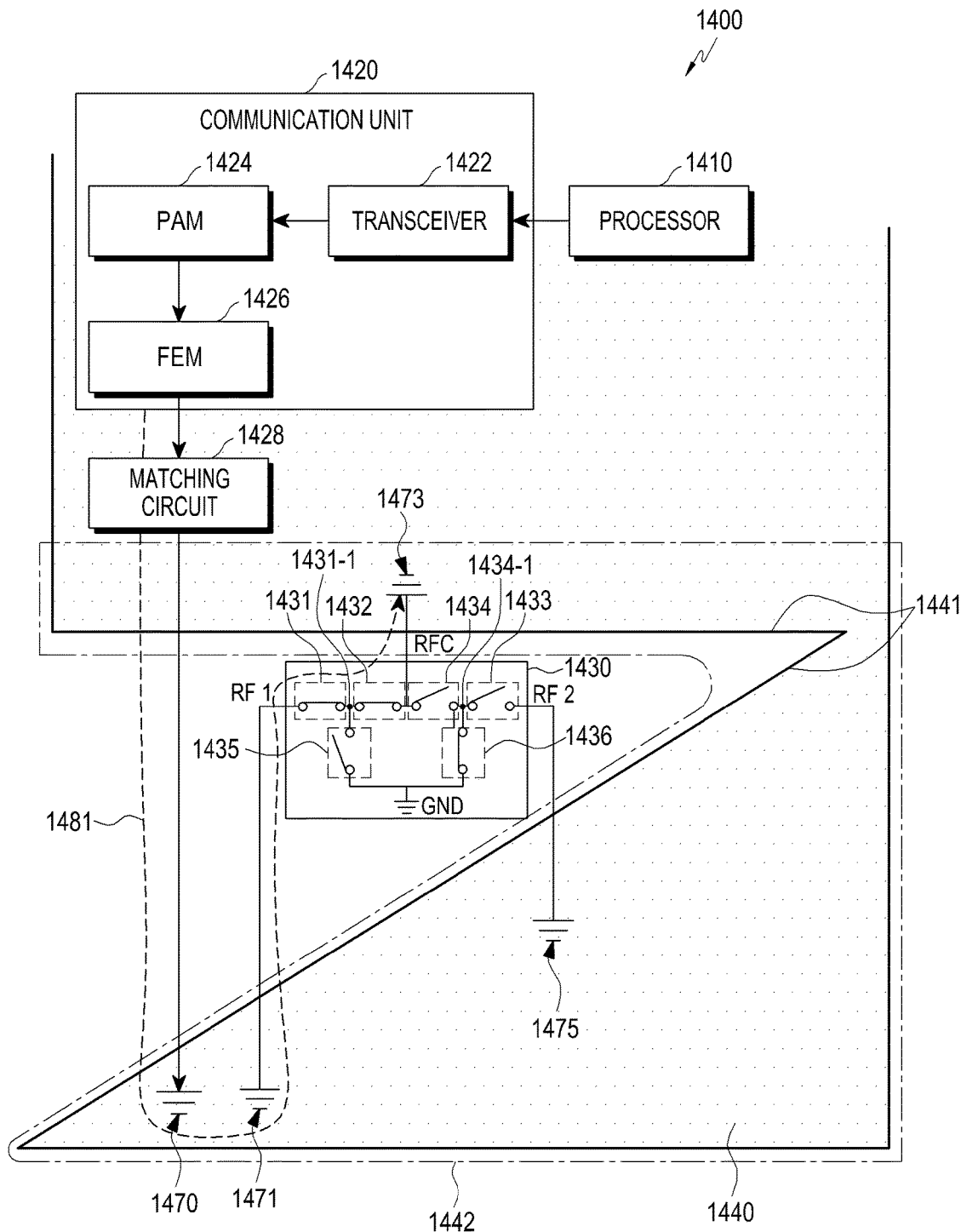
FIGS. 14A and 14B are views illustrating examples of placing and operating a switching unit according to an embodiment of the present disclosure.
Figure 14B:
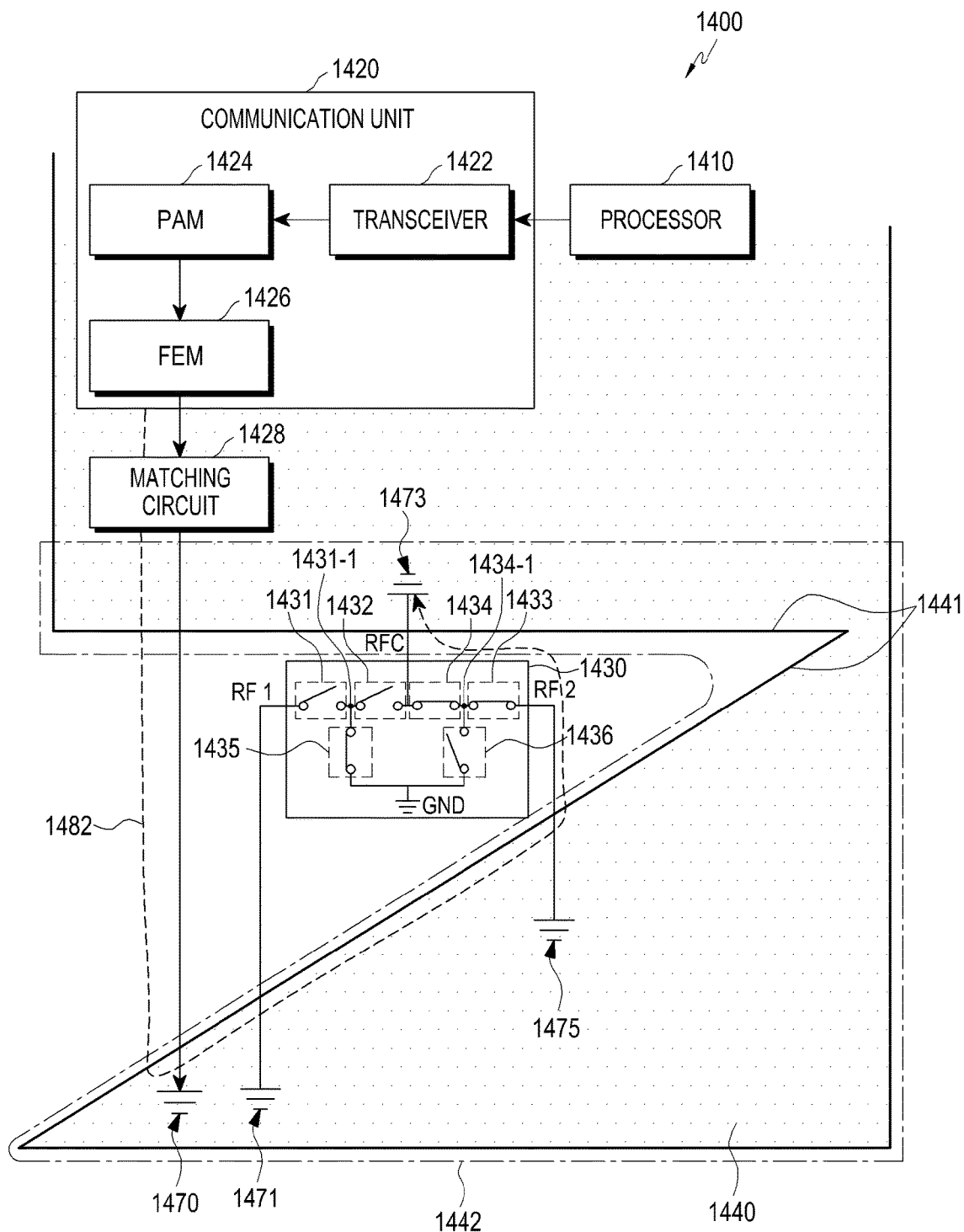

FIGS. 14A and 14B are views illustrating examples of placing and operating a switching unit according to an embodiment of the present disclosure.

According to an embodiment of the present disclosure, an electronic device of FIGS. 14A and 14B may include the whole or part of the electronic device 601 of FIG. 6, the electronic device 701 of FIG. 7, the electronic device 901 of FIG. 9, or the electronic device 1200 of FIG. 12.

Referring to FIGS. 14A and 14B, an electronic device 1400 includes a multiband antenna 1442 that may be part of a PCB 1440 and may be an antenna including a slit unit 1441. A switching unit 1430 may be disposed in a physical space formed by the slit unit 1441 of the multiband antenna 1442. The electronic device 1400 further includes a processor 1410, a communication unit 1420, a matching unit 1428. The communication unit 1420 includes a transceiver 1422, a PAM 1424 and a FEM 1426.

The multiband antenna 1442 may be connected (1470) with the FEM 1426 through a matching circuit 1428, and a second branch point 1473 may be connected with at least one of a first branch point 1471 and a third branch point 1475 through the switching unit 1430. The position of each of the first to third branch points 1471, 1473, and 1475 may previously be designated corresponding to a respective one of multiple bands.

The switching unit 1430 may include a first switch 1431, a second switch 1432, a third switch 1433, a fourth switch 1434, a fifth switch 1435, and a sixth switch 1436.

A processor 1410 may turn on the first switch 1431, the second switch 1432, and the sixth switch 1436 and turn off the third switch 1433, the fourth switch 1434, and the fifth switch 1435, or the processor 1410 may turn off the first switch 1431, the second switch 1432, and the sixth switch 1436 and turn on the third switch 1433, the fourth switch 1434, and the fifth switch 1435.

Referring to FIG. 14A, as the first band is selected from among the multiple bands, the processor 1410 may control the first switch 1431, the second switch 1432, and the sixth switch 1436 to turn on and the third switch 1433, the fourth switch 1434, and the fifth switch 1435 to turn off, forming a first path 1481.

As the first switch 1431 and the second switch 1432 turn on, the first branch point 1471 and the second branch point 1473 of the multiband antenna 1442 may be connected together. As the third switch 1433 and the fourth switch 1434 turn off, the third branch point 1475 and the second branch point 1473 of the multiband antenna may be disconnected from each other. As the first branch point 1471 and the second branch point 1473 of the multiband antenna 1442 are connected together, a signal provided to the multiband antenna 1442 may flow from the first branch point 1471 to the second branch point 1473, forming the first path 1481. The signal flow along the first path 1481 allows a first signal to be emitted from the multiband antenna 1442. Although the fourth switch 1434 turns off, a predetermined voltage may be applied to the fourth switch 1434 by, e.g., parasitic capacitance of the fourth switch 1434. When the Vpeak exceeds a predetermined value, harmonics may be generated and emitted together with the first signal. As the sixth switch 1436 turns on, the second node 1434-1 and the ground may be connected together, and the signal by the voltage applied to the fourth switch 1434 may be grounded and thus removed. As the third switch 1433 turns off, a parasitic loop may be prevented from occurring in the direction from the third branch point 1475 to the ground. Absent the third switch 1433, the signal by the voltage applied to the fourth switch 1434 might be grounded, causing a parasitic loop in the direction from the third branch point 1475 to the ground. The parasitic loop may be generated in a reverse direction of the first path 1481, attenuating or affecting the signal flowing through the first path 1481 from the first branch point 1471 to the second branch point 1473, and resultantly influencing the emission of first-band signal from the multiband antenna 1442. The parasitic loop might not occur as the third switch 1433 between the second node 1434-1 and the third branch point 1475 turns off.

Referring to FIG. 14B, as the second band is selected from among the multiple bands, the processor 1410 may control the first switch 1431, the second switch 1432, and the sixth switch 1436 to turn off and the third switch 1433, the fourth switch 1434, and the fifth switch 1435 to turn off, forming a second path 1482 corresponding to the second band.

As the first switch 1431 and the second switch 1432 turn off, the first branch point 1471 and the second branch point 1473 of the multiband antenna 1442 may be disconnected from each other. As the third switch 1433 and the fourth switch 1434 turn off, the third branch point 1475 and the second branch point 1473 of the multiband antenna may be connected together. As the third branch point 1475 and the second branch point 1473 of the multiband antenna 1442 are connected together, a signal provided to the multiband antenna 1442 may flow from the third branch point 1475 to the second branch point 1473, forming the second path 1482. The signal flow along the first path 1481 allows a second signal to be emitted from the multiband antenna 1442. Although the second switch 1432 turns off, a predetermined voltage may be applied to the second switch 1432 by, e.g., parasitic capacitance of the second switch 1432. When the Vpeak exceeds an allowed value for the switch, harmonics may be generated, influencing the emission of the second signal. As the fifth switch 1435 turns on, the first node 1431-1 and the ground may be connected together, and the signal by the voltage applied to the second switch 1432 may be grounded and thus removed. As the first switch 1431 turns off, a parasitic loop may be prevented from occurring in the direction from the first branch point 1471 to the ground. Absent the first switch 1431, the signal by the voltage applied to the second switch 1432 might be grounded, causing a parasitic loop in the direction from the first branch point 1471 to the ground. The parasitic loop may be generated in a reverse direction of the second path 1482, attenuating or affecting the signal flowing through the second path 1482 from the third branch point 1475 to the second branch point 1473 and resultantly influencing the emission of second-band signal from the multiband antenna 1442. The parasitic loop might not occur as the first switch 1431 between the first node 1431-1 and the first branch point 1471 turns off.

Figure 15:
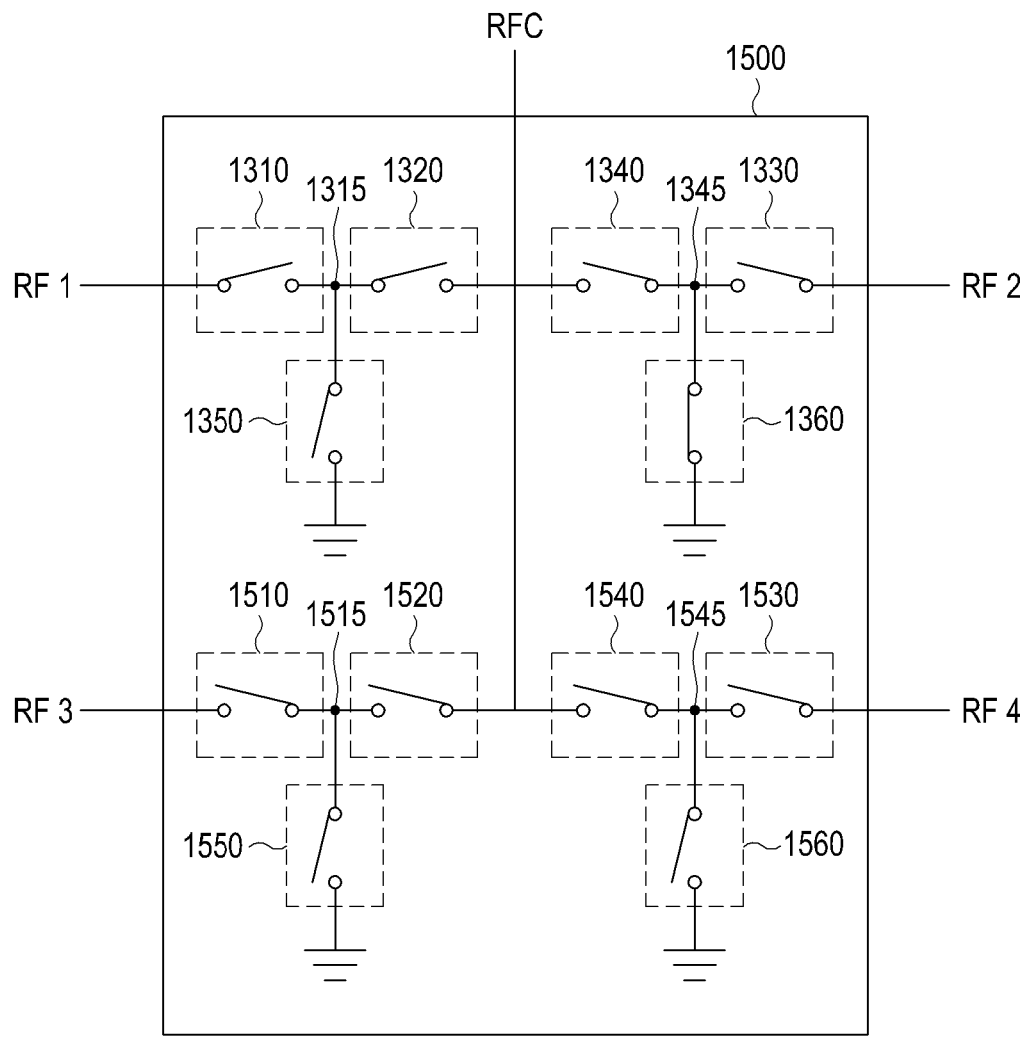
FIG. 15 is a view illustrating an antenna switch according to an embodiment of the present disclosure.

FIG. 15 is a view illustrating a switching unit according to an embodiment of the present disclosure.

According to an embodiment of the present disclosure, the switching unit of FIG. 15 may include the whole or part of the switching unit 1230 of FIG. 12 of the switching unit 1430 of FIGS. 14A and 14B.

Referring to FIG. 15, a switching unit 1500 may include a first terminal RFC connected to a first branch point of a multiband antenna, a second terminal RF1 connected to a second branch point of the multiband antenna, a third terminal RF2 connected to a third branch point of the multiband antenna, a fourth terminal RF3 connected to a fourth branch point of the multiband antenna, and a fifth terminal RF4 connected to a fifth branch point of the multiband antenna. The first terminal RFC may be a pole, and the second to fifth terminals, each, may be a throw.

According to an embodiment of the present disclosure, the switching unit 1500 includes the first switch 1310, the second switch 1320, the third switch 1330, the fourth switch 1340, the fifth switch 1350, and the sixth switch 1360. The switching unit 1500 may further include a seventh switch 1510, an eighth switch 1520, a ninth switch 1530, a tenth switch 1540, an eleventh switch 1550, and a twelfth switch 1560.

The first switch 1310 may be connected with the first branch point of the multiband antenna. The second switch 1320 may be connected between the first switch 1310 and the second branch point of the multiband antenna. The third switch 1330 may be connected with the third branch point of the multiband antenna. The fourth switch 1340 may be connected between the third switch 1330 and the second branch point of the multiband antenna. The fifth switch 1350 may be connected between the first node 1315 between the first switch 1310 and the second switch 1320 and the ground. The sixth switch 1360 may be connected between the second node 1345 between the third switch 1330 and the fourth switch 1340 and the ground.

The seventh switch 1510 may be connected with the fourth branch point of the multiband antenna. The eighth switch 1520 may be connected between the seventh switch 1510 and the second branch point of the multiband antenna. The ninth switch 1530 may be connected with the fifth branch point of the multiband antenna. The tenth switch 1540 may be connected between the ninth switch 1530 and the second branch point of the multiband antenna. The eleventh switch 1550 may be connected between the third node 1515 between the seventh switch 1510 and the eighth switch 1520 and the ground. The twelfth switch 1560 may be connected between the fourth node 1545 between the ninth switch 1530 and the tenth switch 1540 and the ground.

Figure 16A:
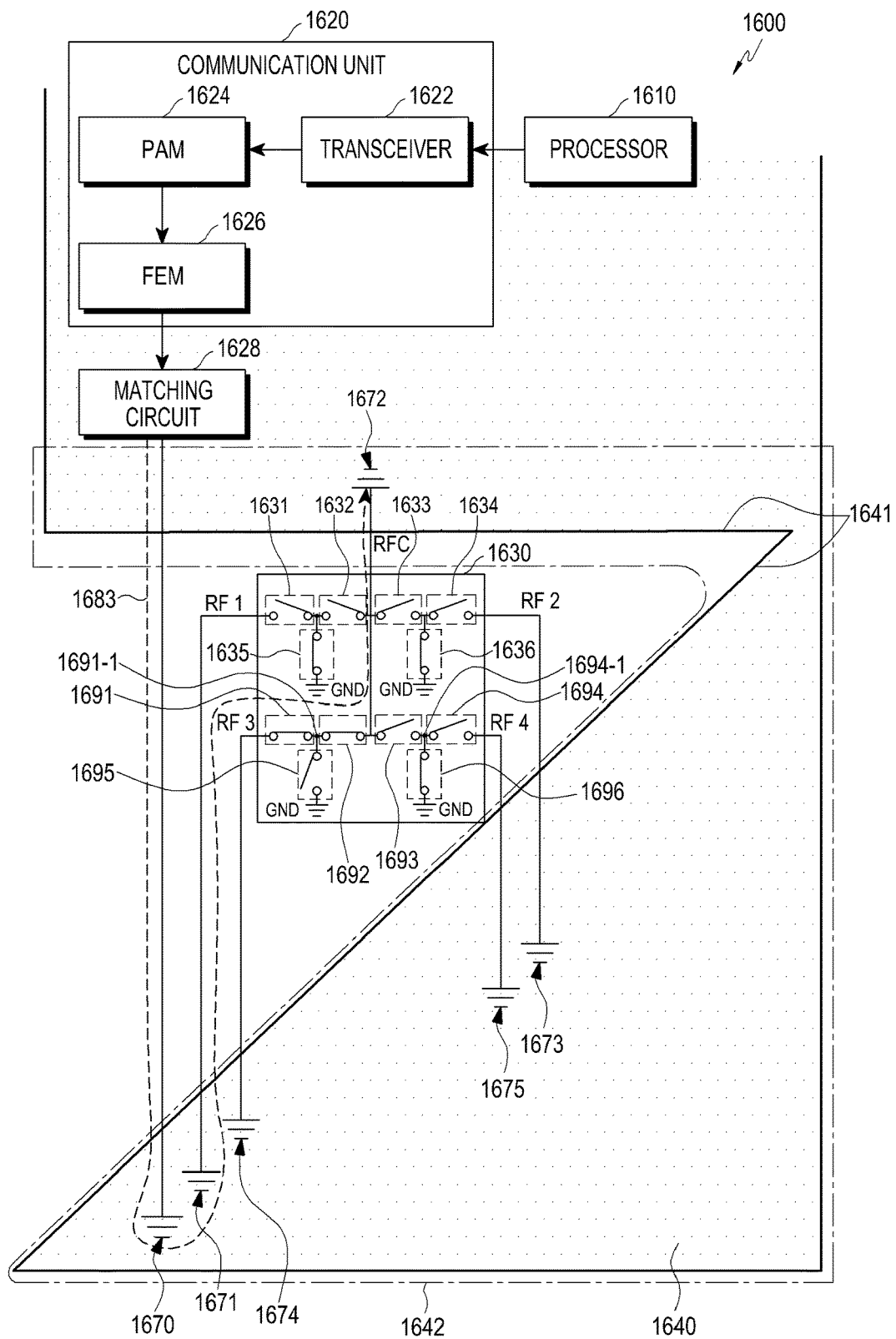
FIGS. 16A and 16B are views illustrating examples of placing and operating an antenna switch according to an embodiment of the present disclosure.
Figure 16B:
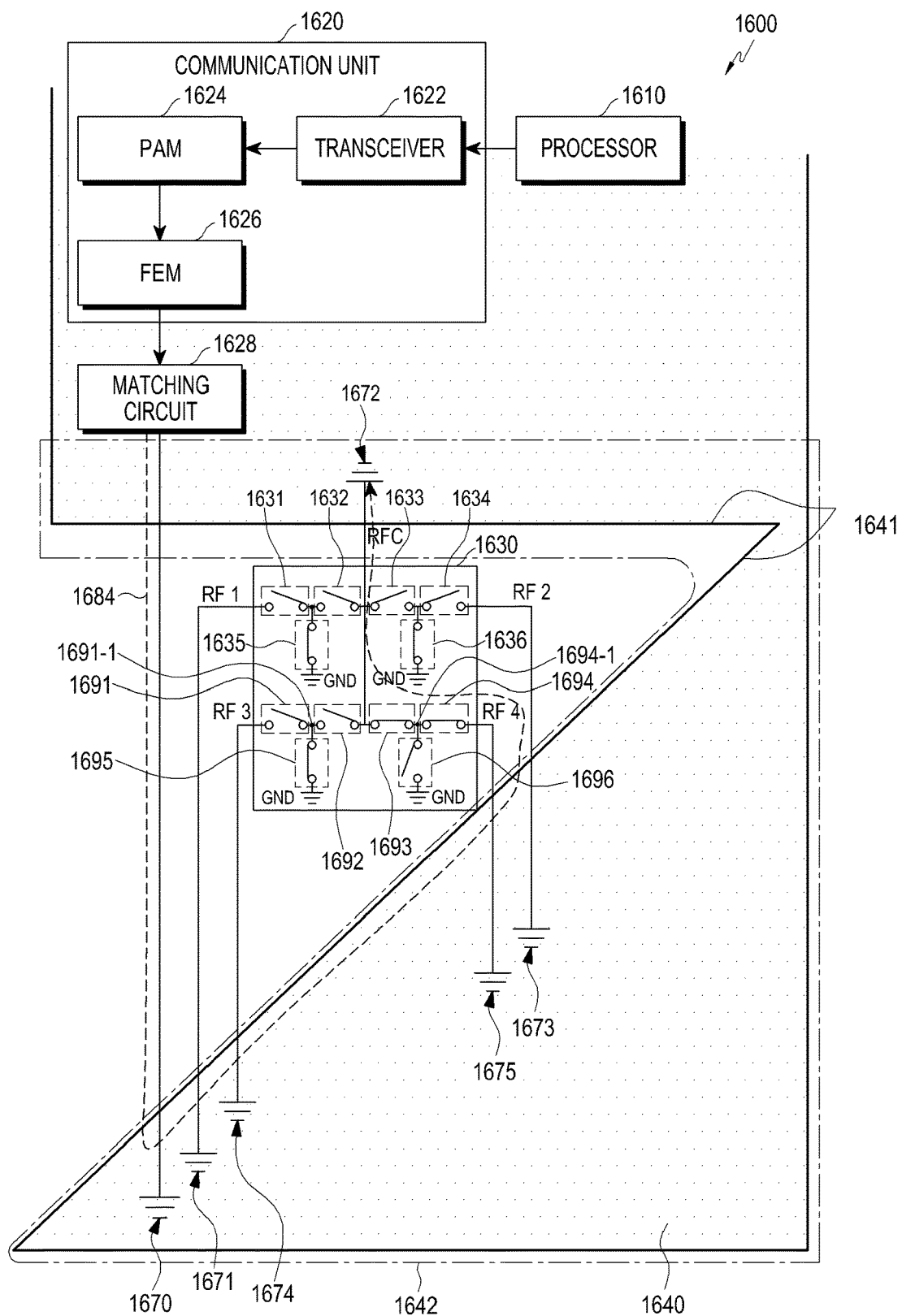

FIGS. 16A and 16B are views illustrating examples of placing and operating a switching unit according to an embodiment of the present disclosure.

According to an embodiment of the present disclosure, an electronic device of FIGS. 16A and 16B may include the whole or part of the electronic device 601 of FIG. 6, the electronic device 701 of FIG. 7, the electronic device 901 of FIG. 9, the electronic device 1200 of FIG. 12, or the electronic device 1400 of FIGS. 14A and 14B.

Referring to FIGS. 16A and 16B, an electronic device 1600 may include a multiband antenna 1642 that may be part of a PCB 1640 and may be an antenna including a slit unit 1641. A switching unit 1630 may be disposed in a physical space formed by the slit unit 1641. The electronic device 1600 further includes a processor 1610, a communication unit 1620, a matching unit 1428. The communication unit 1620 includes a transceiver 1622, a PAM 1624 and a FEM 1626.

The multiband antenna 1642 may be connected (1670) with the FEM 1626 through a matching circuit 1628, and a second branch point 1672 may be connected with at least one of a first branch point 1671, a third branch point 1673, a fourth branch point 1674, and a fifth branch point 1675 through the switching unit 1630. The position of each of the first to fifth branch points 1671, 1672, 1673, 1674, and 1675 may previously be designated corresponding to a respective one of multiple bands.

The switching unit 1630 includes a first switch 1631, a second switch 1632, a third switch 1633, a fourth switch 1634, a fifth switch 1635, a sixth switch 1636, a seventh switch 1691, an eighth switch 1692, a ninth switch 1693, a tenth switch 1694, an eleventh switch 1695, and a twelfth switch 1696.

A processor 1610 may turn on the first switch 1631, the second switch 1632, and the sixth switch 1636, turn off the third switch 1633, the fourth switch 1634, and the fifth switch 1635, turn off the seventh switch 1691, the eighth switch 1692, the ninth switch 1693, and the tenth switch 1694, and turn on the eleventh switch 1695 and the twelfth switch 1696, forming a first path.

The processor 1610 may turn off the first switch 1631, second switch 1632, and the sixth switch 1636, turn on the third switch 1633, the fourth switch 1634, and the fifth switch 1635, turn off the seventh switch 1691, the eighth switch 1692, the ninth switch 1693, and the tenth switch 1694, and turn on the eleventh switch 1695 and the twelfth switch 1696, forming a second path.

The processor 1610 may turn off the first switch 1631, the second switch 1632, the third switch 1633, and the fourth switch 1634, turn on the fifth switch 1635 and the sixth switch 1636, turn on the seventh switch 1691, the eighth switch 1692, and the twelfth switch 1696, and turn off the ninth switch 1693, the tenth switch 1694, and the eleventh switch 1695, forming a third path 1683.

The processor 1610 may turn off the first switch 1631, the second switch 1632, the third switch 1633, and the fourth switch 1634, turn on the fifth switch 1635 and the sixth switch 1636, turn off the seventh switch 1691, the eighth switch 1692, and the twelfth switch 1696, and turn on the ninth switch 1693, the tenth switch 1694, and the eleventh switch 1695, forming a fourth path 1684.

Referring to FIG. 16A, as the third band is selected from among the multiple bands, the processor 1610 may perform control to turn off the first switch 1631, the second switch 1632, the third switch 1633, and the fourth switch 1634, turn on the fifth switch 1635 and the sixth switch 1636, turn on the seventh switch 1691, the eighth switch 1692, and the twelfth switch 1696, and turn off the ninth switch 1693, the tenth switch 1694, and the eleventh switch 1695, forming the third path 1683.

As the seventh switch 1691 and the eight switch 1692 turn on, the fourth branch point 1674 and the second branch point 1672 of the multiband antenna 1642 may be connected together. As the first switch 1631, the second switch 1632, the third switch 1633, the fourth switch 1634, the ninth switch 1693, and the tenth switch 1694 turn off, the connection between the second branch point 1672 and the first branch point 1671 of the multiband antenna 1642, the connection between the second branch point 1672 and the third branch point 1673, and the connection between the second branch point 1672 and the fifth branch point 1675 may be released. As the fourth branch point 1674 and the second branch point 1672 of the multiband antenna 1642 are connected together, a signal provided to the multiband antenna 1642 may flow from the fourth branch point 1674 to the second branch point 1672, forming a third path 1683. The signal flow along the third path 1683 allows a third-band signal to be emitted from the multiband antenna 1642. Although the ninth switch 1693 turns off, a predetermined voltage may be applied to the ninth switch 1693 by, e.g., parasitic capacitance of the ninth switch 1693. When the Vpeak exceeds an allowed value, harmonics may be generated and emitted together with the third-band signal. As the twelfth switch 1696 turns on, the fourth node 1694-1 and the ground may be connected together, and the signal by the voltage applied to the ninth switch 1693 may be grounded and thus removed. As the tenth switch 1694 turns off, a parasitic loop may be blocked off that may occur in the direction from the fifth branch point 1675 to the ground. Absent the tenth switch 1694, the signal by the voltage applied to the ninth switch 1693 might be rendered to flow to the ground, causing a parasitic loop in the direction from the fifth branch point 1675 to the ground. The parasitic loop may be generated in a reverse direction of the third path 1683, attenuating or affecting the signal flowing through the third path 1683 from the fourth branch point 1674 to the second branch point 1672 and resultantly influencing the emission of third-band signal from the multiband antenna 1642. The parasitic loop might not occur as the tenth switch 1694 between the fourth node 1694-1 and the fifth branch point 1675 turns off.

Referring to FIG. 16B, as the fourth band is selected from among the multiple bands, the processor 1610 may perform control to turn off the first switch 1631, the second switch 1632, the third switch 1633, and the fourth switch 1634, turn on the fifth switch 1635 and the sixth switch 1636, turn off the seventh switch 1691, the eighth switch 1692, and the twelfth switch 1696, and turn on the ninth switch 1693, the tenth switch 1694, and the eleventh switch 1695, forming the fourth path 1684.

As the ninth switch 1693 and the tenth switch 1694 turn on, the fifth branch point 1675 and the second branch point 1672 of the multiband antenna 1642 may be connected together. As the first switch 1631, the second switch 1632, the third switch 1633, the fourth switch 1634, the seventh switch 1691, and the eighth switch 1692 turn off, the connection between the second branch point 1672 and the first branch point 1671 of the multiband antenna 1642, the connection between the second branch point 1672 and the third branch point 1673, and the connection between the second branch point 1672 and the fourth branch point 1674 may be released. As the fifth branch point 1675 and the second branch point 1672 of the multiband antenna 1642 are connected together, a signal provided to the multiband antenna 1642 may flow from the fifth branch point 1675 to the second branch point 1672, forming a fourth path 1684. The signal flow along the fourth path 1684 allows a fourth-band signal to be emitted from the multiband antenna 1642. Although the eighth switch 1692 turns off, a predetermined voltage may be applied to the eighth switch 1692 by, e.g., parasitic capacitance of the eighth switch 1692. When the Vpeak exceeds an allowed value, harmonics may be generated and emitted together with the fourth-band signal. As the eleventh switch 1695 turns on, the third node 1691-1 and the ground may be connected together, and the signal by the voltage applied to the eighth switch 1692 may be grounded and thus removed. As the seventh switch 1691 turns off, a parasitic loop may be prevented from occurring in the direction from the fourth branch point 1674 to the ground. Absent the seventh switch 1691, the signal by the voltage applied to the eighth switch 1692 might be grounded, causing a parasitic loop in the direction from the fourth branch point 1674 to the ground. The parasitic loop may be generated in a reverse direction of the fourth path 1684, attenuating or affecting the signal flowing through the fourth path 1684 from the fifth branch point 1675 to the second branch point 1672 and resultantly influencing the emission of fourth-band signal from the multiband antenna 1642. The parasitic loop might not occur as the seventh switch 1691 between the third node 1691-1 and the fourth branch point 1674 turns off.

Figure 17:
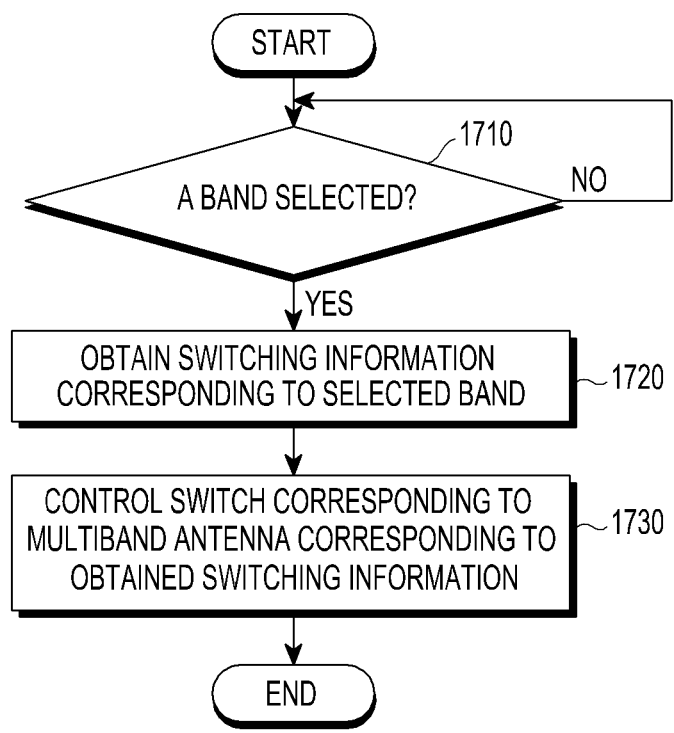
FIG. 17 is a flowchart illustrating a switching operation by an antenna switch in an electronic device according to an embodiment of the present disclosure.

FIG. 17 is a flowchart illustrating a switching operation by an antenna switch in an electronic device according to an embodiment of the present disclosure.

Referring to FIG. 17, an electronic device (e.g., the electronic device 601, the electronic device 701, or the electronic device 901) may determine whether any one of multiple bands is selected in operation 1710. According to an embodiment of the present disclosure, the electronic device may select any one from among a 700 Mhz, 850 Mhz, 900 Mhz 1.8 Ghz, 1.9 Ghz, 2.1 Ghz, and 2.6 Ghz band as the communication band.

The processor (e.g., the processor 620, the processor 710, or the processor 910) may obtain switching information corresponding to the selected band in operation 1720. According to an embodiment of the present disclosure, the processor (e.g., the processor 620, the processor 710, or the processor 910) may obtain the switching information corresponding to the selected band using per-band switching information stored in the memory. According to an embodiment of the present disclosure, the switching information may be on/off information about at least one or more switches that may connect a first branch point corresponding to the selected band among a plurality of branch points of a multiband antenna with a second branch point corresponding to a ground. According to an embodiment of the present disclosure, when an antenna for multiband communication is connected with a switching unit including a first switch connected with a first branch point of the antenna, a second switch connected between the first switch and a second branch point of the antenna, a third switch connected with a third branch point of the antenna, a fourth switch connected between the second branch point and the third switch, a fifth switch connected between a first node between the first switch and the second switch and a ground, and a sixth switch connected between a second node between the third switch and the fourth switch and the ground, a processor (e.g., the processor 620, the processor 710, or the processor 910) may obtain first switching information enabling a first path corresponding to a first band to be formed as the first band is selected from among the multiple bands and obtain second switching information enabling a second path corresponding to a second band to be formed as the second band is selected from among the multiple bands.

In operation 1730, the processor (e.g., the processor 620, the processor 710, or the processor 910) may control the switch corresponding to the multiband antenna corresponding to the obtained switching information. According to an embodiment of the present disclosure, when an antenna for multiband communication is connected with a switching unit including a first switch connected with a first branch point of the antenna, a second switch connected between the first switch and a second branch point of the antenna, a third switch connected with a third branch point of the antenna, a fourth switch connected between the second branch point and the third switch, a fifth switch connected between a first node between the first switch and the second switch and a ground, and a sixth switch connected between a second node between the third switch and the fourth switch and the ground, a processor (e.g., the processor 620, the processor 710, or the processor 910) may turn on the first switch, the second switch, and the sixth switch and turn off the third switch, the fourth switch, and the fifth switch to form a first path corresponding to a first band according to obtaining first switching information. The processor (e.g., the processor 620, the processor 710, or the processor 910) may turn off the first switch, the second switch, and the sixth switch and turn on the third switch, the fourth switch, and the fifth switch to form a second path corresponding to a second band according to obtaining second switching information.

Each of the aforementioned components of the electronic device may include one or more parts, and a name of the part may vary with a type of the electronic device. The electronic device in accordance with various embodiments of the present disclosure may include at least one of the aforementioned components, omit some of them, or include other additional component(s). Some of the components may be combined into an entity, but the entity may perform the same functions as the components may do.

The term 'module' may refer to a unit including one of hardware, software, and firmware, or a combination thereof. The term 'module' may be interchangeably used with a unit, logic, logical block, component, or circuit. The module may be a minimum unit or part of an integrated component. The module may be a minimum unit or part of performing one or more functions. The module may be implemented mechanically or electronically. For example, the module may include at least one of application specific integrated circuit (ASIC) chips, field programmable gate arrays (FPGAs), or programmable logic arrays (PLAs) that perform some operations, which have already been known or will be developed in the future.

According to an embodiment of the present disclosure, at least a part of the device (e.g., modules or their functions) or method (e.g., operations) may be implemented as instructions stored in a computer-readable storage medium e.g., in the form of a program module. The instructions, when executed by a processor (e.g., the processor 120), may enable the processor to carry out a corresponding function. The computer-readable storage medium may be e.g., the memory 130.

The computer-readable storage medium may include a hardware device, such as hard discs, floppy discs, and magnetic tapes (e.g., a magnetic tape), optical media such as compact disc ROMs (CD-ROMs) and digital versatile discs (DVDs), magneto-optical media such as floptical disks, ROMs, RAMs, flash memories, and/or the like. Examples of the program instructions may include not only machine language codes but also high-level language codes which are executable by various computing means using an interpreter. The aforementioned hardware devices may be configured to operate as one or more software modules to carry out various embodiments of the present disclosure, and vice versa.

Modules or programming modules in accordance with various embodiments of the present disclosure may include at least one or more of the aforementioned components, omit some of them, or further include other additional components. Operations performed by modules, programming modules or other components in accordance with various embodiments of the present disclosure may be carried out sequentially, simultaneously, repeatedly, or heuristically. Furthermore, some of the operations may be performed in a different order, or omitted, or include other additional operation(s).

As is apparent from the foregoing description, according to an embodiment of the present disclosure, it is possible to remove spurious harmonics that are generated when a signal higher than the Vpeak value is applied to the switch applied to the multiband antenna in the multiband antenna-equipped electronic device, preventing an RSE from occurring.

According to an embodiment of the present disclosure, an RSE through the antenna may be prevented in the multiband antenna-equipped electronic device, allowing the electronic device to meet pre-defined RSE standards.

According to an embodiment of the present disclosure, it is possible to remove spurious harmonics that are generated from the off-state switches among the switches applied to the multiband antenna, preventing a parasitic loop from occurring.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a housing;
   a memory;
   an antenna including a first point, a second point, and a third point specified corresponding to multiple bands for multi-band communication;
   a communication unit processing a radio frequency (RF) signal using the antenna;
   a switching unit comprising:
      a first switch connected with the first point of the antenna,
      a second switch connected between the first switch and the second point of the antenna,
      a third switch connected with the third point of the antenna,
      a fourth switch connected between the second point and the third switch,
      a fifth switch connected between a first node between the first switch and the second switch and a ground, and
      a sixth switch connected between a second node between the third switch and the fourth switch and the ground; and
   a processor electrically connected with the memory, the communication unit, and the switching unit,
   wherein the memory stores instructions executed to enable the processor to perform control to:
      turn on the first switch, the second switch, and the sixth switch and turn off the third switch, the fourth switch, and the fifth switch for connecting the first point and the second point to form a first path, or
      turn off the first switch, the second switch, and the sixth switch and turn on the third switch, the fourth switch, and the fifth switch for connecting the second point and the third point to form a second path.

2. The electronic device of claim 1, wherein the first switch, the second switch, the third switch, the fourth switch, the fifth switch, and the sixth switch are included in at least one switch module.

3. The electronic device of claim 1, wherein the instructions are configured to enable the processor to perform control to one of:
   turn on the first switch, the second switch, and the sixth switch and turn off the third switch, the fourth switch, and the fifth switch to form the first path corresponding to a first band as the first band is selected from among the multiple bands, or
   turn off the first switch, the second switch, and the sixth switch and turn on the third switch, the fourth switch, and the fifth switch to form the second path corresponding to a second band as the second band is selected from among the multiple bands.

4. The electronic device of claim 3, wherein the first switch, the second switch, the third switch, the fourth switch, the fifth switch, and the sixth switch each comprise at least one or more field effect transistor (FET) devices.

5. The electronic device of claim 4, wherein the communication unit comprises:
   a transceiver configured to modulate and demodulate the RF signal,
   a power amp module (PAM) configured to amplify the modulated or demodulated RF signal, and
   a front-end module (FEM) configured to:
      split and filter amplified transmit signal and receive signal, transferring the transmit signal to the antenna, and
      receive the receive signal through the antenna.

6. The electronic device of claim 4, further comprising a matching circuit between the communication unit and the antenna.

7. The electronic device of claim 3,
   wherein the first band and the second band comprises any one of a 700 Mhz band, an 850 Mhz band, a 900 Mhz band, a 1.8 Ghz band, a 1.9 Ghz band, a 2.1 Ghz band, or a 2.6 Ghz band, and
   wherein the first band differs from the second band.

8. The electronic device of claim 3,
   wherein the antenna further includes a fourth point and a fifth point,
   wherein the switching unit further comprises:
      a seventh switch connected with the fourth point of the antenna, an eighth switch connected between the seventh switch and the second point of the antenna, a ninth switch connected with the fifth point of the antenna, a tenth switch connected between the second point and the ninth switch, an eleventh switch connected between a third node between the seventh switch and the eighth switch and the ground, and a twelfth switch connected between a fourth node between the ninth switch and the tenth switch and the ground, and wherein the instructions are configured to enable the processor to perform control to one of:

turn on the seventh switch, the eighth switch, and the twelfth switch and turn off the ninth switch, the tenth switch, and the eleventh switch for connecting the second point and the fourth point to form a third path, or turn off the seventh switch, the eighth switch, and the twelfth switch and turn on the ninth switch, the tenth switch, and the eleventh switch for connecting the second point and the fifth point to form a fourth path.

9. The electronic device of claim 8, wherein the instructions are configured to enable the processor to perform control to one of:

turn on the seventh switch, the eighth switch, and the twelfth switch and turn off the ninth switch, the tenth switch, and the eleventh switch to form the third path corresponding to a third band through the antenna as the third band is selected from among the multiple bands, and turn off the seventh switch, the eighth switch, and the twelfth switch and turn on the ninth switch, the tenth switch, and the eleventh switch to form the fourth path corresponding to a fourth band through the antenna as the fourth band is selected from among the multiple bands.

10. The electronic device of claim 9, wherein the seventh switch, the eighth switch, the ninth switch, the tenth switch, the eleventh switch, and the twelfth switch each comprise at least one or more FET devices.

11. The electronic device of claim 9, wherein the third band and the fourth band differ from the first band and the second band and differ from each other, and wherein the third band and the fourth band include any one of a 700 Mhz band, an 850 Mhz band, a 900 Mhz band, a 1.8 Ghz band, a 1.9 Ghz band, a 2.1 Ghz band, or a 2.6 Ghz band.

12. The electronic device of claim 1, wherein the antenna has a slit, and wherein the switching unit is disposed within the slit of the antenna.

13. A method for switching in an electronic device comprising an antenna including a first point, a second point, and a third point specified corresponding to multiple bands for multiband communication and a switching unit, the switching unit including a first switch connected with the first point of the antenna, a second switch connected between the first switch and the second point of the antenna, a third switch connected with the third point of the antenna, a fourth switch connected between the second point and the third switch, a fifth switch connected between a first node between the first switch and the second switch and a ground, and a sixth switch connected between a second node between the third switch and the fourth switch and the ground, the method comprising:

turning on the first switch, the second switch, and the sixth switch and turning off the third switch, the fourth switch, and the fifth switch for connecting the first point and the second point to form a first path corresponding to a first band when the first band is selected from among the multiple bands; and turning off the first switch, the second switch, and the sixth switch and turning on the third switch, the fourth switch, and the fifth switch for connecting the second point and the third point to form a second path corresponding to a second band when the second band is selected from among the multiple bands.

14. The method of claim 13, wherein the first switch, the second switch, the third switch, the fourth switch, the fifth switch, and the sixth switch each comprise at least one or more FET devices.

15. The method of claim 13, wherein the first band and the second band comprise any one of a 700 Mhz band, an 850 Mhz band, a 900 Mhz band, a 1.8 Ghz band, a 1.9 Ghz band, a 2.1 Ghz band, and a 2.6 Ghz band, or wherein the first band differs from the second band.

16. The method of claim 13, wherein the antenna further includes a fourth point and a fifth point, wherein the switching unit further comprises:

a seventh switch connected with the fourth point of the antenna, an eighth switch connected between the seventh switch and the second point of the antenna, a ninth switch connected with the fifth point of the antenna, a tenth switch connected between the second point and the ninth switch, an eleventh switch connected between a third node between the seventh switch and the eighth switch and the ground, and a twelfth switch connected between a fourth node between the ninth switch and the tenth switch and the ground, and wherein the method further comprises:

turning on the seventh switch, the eighth switch, and the twelfth switch and turning off the ninth switch, the tenth switch, and the eleventh switch for connecting the second point and the fourth point to form a third path corresponding to a third band through the antenna when the third band is selected from among the multiple bands; and turning off the seventh switch, the eighth switch, and the twelfth switch and turning on the ninth switch, the tenth switch, and the eleventh switch for connecting the second point and the fifth point to form a fourth path corresponding to a fourth band through the antenna when the fourth band is selected from among the multiple bands.

17. The method of claim 16, wherein the seventh switch, the eighth switch, the ninth switch, the tenth switch, the eleventh switch, and the twelfth switch each comprise at least one or more FET devices.

18. The method of claim 16, wherein the third band and the fourth band differ from the first band and the second band and differ from each other, and wherein the third band and the fourth band include any one of a 700 Mhz band, an 850 Mhz band, a 900 Mhz band, a 1.8 Ghz band, a 1.9 Ghz band, a 2.1 Ghz band, or a 2.6 Ghz band.

19. The method of claim 16, wherein the forming of the fourth path prevents generation of a parasitic loop in a reverse by cutting the connection between the third node and the fourth point.

20. The method of claim 13,
wherein the antenna has a slit, and
wherein the switching unit is disposed within the slit of the antenna.

* * * * *